(12) United States Patent
Hong et al.

(10) Patent No.: US 8,836,554 B2
(45) Date of Patent: Sep. 16, 2014

(54) DIGITAL-TO-ANALOG CONVERTER (DAC) CIRCUIT AND WEIGHT ERROR ESTIMATION/CALIBRATION METHOD THEREOF

(71) Applicant: National Chiao Tung University, Hsinchu (TW)

(72) Inventors: Hao-Chiao Hong, Hsinchu (TW); Yu-Shien Wang, Kaohsiung (TW)

(73) Assignee: National Chiao Tung University, Hsinshu (TW)

( * ) Notice: Subject to any disclaimer, the term of this patent is extended or adjusted under 35 U.S.C. 154(b) by 0 days.

(21) Appl. No.: 13/948,322

(22) Filed: Jul. 23, 2013

(65) Prior Publication Data
US 2014/0167988 A1    Jun. 19, 2014

(30) Foreign Application Priority Data
Dec. 14, 2012   (TW) .............................. 101147417 A

(51) Int. Cl.
*H03M 1/10* (2006.01)

(52) U.S. Cl.
CPC .................................. *H03M 1/1009* (2013.01)
USPC ........... 341/120; 341/146; 341/118; 341/155; 341/145; 341/130

(58) Field of Classification Search
CPC .. H03M 1/1009; H02M 3/157; G01N 24/081; G01R 33/44; G01R 33/4608; G01R 31/2841
USPC .................................................. 341/118–172
See application file for complete search history.

(56) References Cited

U.S. PATENT DOCUMENTS

| 7,002,496 | B2 | 2/2006 | Kuyel | |
| 7,129,879 | B1 * | 10/2006 | Glibbery | 341/155 |
| 7,142,138 | B2 * | 11/2006 | Chen et al. | 341/120 |
| 7,362,247 | B2 * | 4/2008 | Arias et al. | 341/118 |
| 7,688,238 | B2 * | 3/2010 | Lewis et al. | 341/120 |
| 7,839,313 | B2 * | 11/2010 | Kidambi | 341/118 |
| 7,893,853 | B2 | 2/2011 | Lai et al. | |
| 7,969,335 | B2 * | 6/2011 | Arias et al. | 341/118 |
| 8,031,098 | B1 | 10/2011 | Ebner et al. | |
| 8,134,486 | B2 * | 3/2012 | Lai et al. | 341/120 |

(Continued)

OTHER PUBLICATIONS

Yonghua Cong, A 1.5-V 14-Bit 100-MS/s Self-Calibrated DAC; IEEE Journal of Solid-State Circuits, vol. 38, No. 12, Dec. 2003, pp. 2051-2060.
Yusuke Ikeda, Matthias Frey and Akira Matsuzawa; A 14-bit 100-MS/s Digitally Calibrated Binary-Weighted Current-Steering CMOS DAC without Calibration ADC; IEEE Asian Solid-State Circuits Conference, Nov. 12-14, 2007, pp. 356-359.
Tao Chen, Georges G.E. Gielen; A 14-bit 200-MHz Current-Steering DAC with Switching-Sequence Post-Adjusting Calibration; IEEE Journal of Solid-State Circuits, vol. 42, No. 11, Nov. 2007, pp. 2386-2394.

*Primary Examiner* — Lam T Mai
(74) *Attorney, Agent, or Firm* — Rosenberg, KLein & Lee

(57) ABSTRACT

The present invention discloses a DAC circuit and a weight error estimation/calibration method thereof. In the method, an output switching circuit dynamically selects several conversion cells (at least containing know weight conversion cells (KWCC)) as a reference conversion cell group (RCCG) from all conversion cells, and dynamically selects at least one unknown weight conversion cell (UWCC) from all UWCCs. An ADC digitalizes the difference of the output of RCCG and the sum of the outputs of the UWCCs, and inputs the result to a digital controller. The digital controller controls the input of the RCCG according to the output of the ADC to make the output of the RCCG approximate the output of the UWCC. The digital controller uses the outputs of the ADC to work out the actual weights of the UWCCs and stores the actual weights in a calibration memory.

16 Claims, 17 Drawing Sheets

(56) References Cited

U.S. PATENT DOCUMENTS

| | | | |
|---|---|---|---|
| 8,368,571 B2 * | 2/2013 | Siragusa | 341/118 |
| 8,614,636 B2 * | 12/2013 | Iso et al. | 341/118 |
| 8,659,457 B2 * | 2/2014 | Eliezer et al. | 341/120 |
| 2010/0164765 A1 | 7/2010 | Miyahara et al. | |
| 2014/0097975 A1 * | 4/2014 | Hong et al. | 341/110 |

* cited by examiner

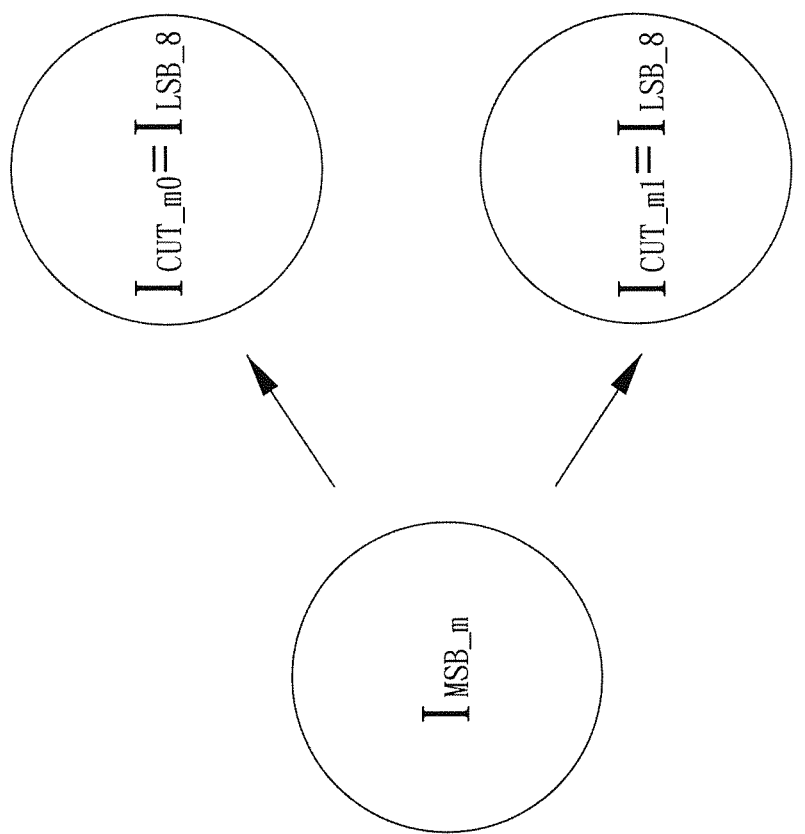

DIGITAL-TO-ANALOG CONVERTER (DAC) CIRCUIT AND WEIGHT ERROR ESTIMATION/CALIBRATION METHOD THEREOF

BACKGROUND OF THE INVENTION

1. Field of the Invention

The present invention relates to a high-resolution data converter, particularly to a calibration method towards a high-resolution data converter.

2. Description of the Related Art

A U.S. Pat. No. 7,893,853 disclosed a "DAC variation-tracking calibration" technology, which uses a set of LSB (Least-Significant Bit) dummy cells to calculate the sum of the LSBs as a standard value and compares the standard value with each MSB (Most-Significant Bit), and which calibrates the value of each MSB to approximate the standard value by adjusting the output of the sub-DAC in each MSB. However, the prior art has a disadvantage of a large area overhead because it costs an additional sub-DAC for each MSB.

Y. Cong and R. Geiger published in IEEE J. Solid-State Circuit vol. 38, pp. 2051-2059, December 2003 a paper "A 1.5-V 14-b 100 MS/s Self-Calibrated DAC," wherein a high-resolution 16-bit ADC is used to calibrate a 14-bit DAC. During booting, the prior art uses a high-resolution ADC to estimate the errors of the MSB current sources of the DAC one by one in a foreground calibration mode. Then, the estimated errors of the MSB current sources are used to compute the calibrated outputs. The prior art has two disadvantages:

1. The resolution of the ADC must be at least 2-bit higher than that of the DAC, resulting in a requirement of a pretty high-resolution ADC. Therefore, the prior art needs a very complicated circuit.
2. The area of the required high-resolution ADC is much larger than that of the DAC itself Yusuke Ikeda, Matthias Frey, and Akira Matsuzawa published in IEEE Asian Solid-State Circuit Conference Nov. 12-14, 2007 a paper "A 14-bit 100 MS/s Digitally Calibrated Binary-Weighted Current-Steering CMOS DAC without Calibration ADC," wherein a 8-bit sub-DAC and 3 calibration bits are used to calibrate a main-DAC. The errors of the current sources in the main-DAC are estimated as a foreground calibration method does during booting and then are used to compute the calibrated outputs. The disadvantage of the prior art is requiring a sub-DAC and additional calibration bits, which increases the area overhead and the complexity of the circuit design.

T. Chen and G. Gielen published in IEEE J. Solid-State Circuit, vol. 42, No. 11, pp. 2386-2394, November 2007 a paper "A 14-bit 200-MHz Current-Steering DAC with Switching-Sequence Post-Adjustment Calibration," wherein a current comparator is used to compare the current values of the MSB current sources, and digital control circuits sort the MSB current sources by their current values and rearrange the switching sequence of the MSB current sources. By pairing a small current source with a large one, the output current can approximate an average value to reduce the output error. However, the prior art requires a great amount of digital control circuits to sort the current sources and rearrange the switching sequence.

According to the discussion above, a great area overhead and high design complexity are the main issues for design high-resolution data converters.

SUMMARY OF THE INVENTION

One objective of the present invention is to provide a digital-to-analog converter (DAC) circuit, wherein a fire-new dynamic conversion cell partition mechanism is used to estimate the actual weights of the unknown weight conversion cells, and wherein the actual weights of the conversion cells are used to calibrate the output of the DAC circuit, whereby the yield and performance of a high-resolution data converter can be enhanced.

In one embodiment, the DAC circuit of the present invention comprises P pieces of conversion cells, an output switching circuit, an analog-to-digital converter (ADC), a digital controller, and a calibration memory, wherein the P pieces of conversion cells comprise A pieces of known weight conversion cells and (P-A) pieces of unknown weight conversion cells.

The output switching circuit electrically connects with the P pieces of conversion cells and receives the output of each conversion cell. In an error estimation mode, the output switching circuit dynamically selects N pieces of conversion cells as a reference conversion cell group from the P pieces of conversion cells according to digital control signals of a reference group, and generates a reference output (Ir) proportionally according to the digital control signals of the reference group. The reference conversion cell group at least contains the A pieces of the known weight conversion cells. The output switching circuit also dynamically selects at least one unknown weight conversion cell as a pre-calibration conversion cell group from the (P-A) pieces of unknown weight conversion cells according to digital control signals of a pre-calibration group, and generates a pre-calibration output (Ic). The pre-calibration output (Ic) is smaller than the maximum of the reference output (Ir).

The ADC, such as a comparator, generates a digital calibration signal (Do) according to the difference of the reference output (Ir) and the pre-calibration output (Ic). The digital controller electrically connects with the ADC and the output switching circuit and generates the digital control signals of the reference group and the digital control signals of the pre-calibration group to make the reference output (Ir) approximate the pre-calibration output (Ic). After receiving the digital calibration signal (Do) generated in the approximation process, the digital controller generates a digital weight output. The digital weight output is used to establish a weight table. According to the weight table, the digital controller works out the actual digital weight of each unknown weight conversion cell. The calibration memory electrically connects with the digital controller and stores the actual digital weights of the unknown weight conversion cells, which the digital controller works out according to the weight table.

In other embodiments, the weights of the A pieces of the known weight conversion cells increase exponentially with base 2. The nominal output weights of the unknown weight conversion cells are identical or increase exponentially with base 2. The digital weight outputs of the weight table are obtained via selecting N pieces of different conversion cells to form different reference conversion cell groups. In a normal conversion mode, the digital controller is designed to receive a digital input signal and control the output switching circuit to generate a calibrated analog output according to the contents of the calibration memory. In one embodiment, the reference output (Ir) and the pre-calibration output (Ic) are differential signals.

Another objective of the present invention is to provide a weight error estimation method for a DAC circuit to cooperate with the abovementioned DAC circuit to overcome the static nonlinear effect caused by process variations.

In one embodiment, the weight error estimation method for a DAC circuit is used to estimate the actual weight of the pre-calibration output (Ic) of the abovementioned DAC circuit and comprises the following steps: selecting M pieces of different pre-calibration conversion cell groups to generate M pieces of different pre-calibration outputs, wherein M is greater than or equal to (P-A); using a successive approximation method to perform estimation, and adjusting the digital control signals of the reference group to make the reference output (Ir) successively approximate the pre-calibration output (Ic), and working out the digital weight output of the pre-calibration output (Ic); using the digital weight output of the pre-calibration output (Ic) to establish a weight table, repeating the abovementioned process until the digital controller can work out the actual digital weight of each unknown weight conversion cell according to the weight table, and storing the actual digital weights of the unknown weight conversion cells in the calibration memory.

In other embodiments, while the weight error estimation method for a DAC circuit uses the successive approximation method to estimate the outputs ($I_{MSB\_1} \sim I_{MSB\_M}$) of M pieces of pre-calibration conversion cell groups one by one, it makes use of the A pieces of known weight conversion cells of the reference conversion cell groups and a portion of the (P-A) pieces of unknown weight conversion cells. During estimation, the digital controller uses a plurality of sets of simultaneous equations corresponding to the contents of the weight table to work out the actual digital weights of the (P-A) pieces of unknown weight conversion cells. The reference output (Ir) and the pre-calibration output (Ic) can be either differential or single-ended signals. The (P-A) unknown weight conversion cells are thermometer coded and provide outputs for the pre-calibration conversion cell groups to function as the pre-calibration output (Ic). In one embodiment, the M pieces of pre-calibration conversion cells are used to form two identical groups; the weight outputs of each group of conversion cells increase exponentially with base 2; thus, there are 2M pieces of outputs of pre-calibration conversion cell groups to function as the pre-calibration output Ic. Each output ($I_{MSB\_1} \sim I_{MSB\_M}$) of the unknown weight conversion cells are partitioned into at least two lower weight outputs to guarantee that the smallest output of the pre-calibration conversion cell groups is not greater than the maximum of the reference output. In the abovementioned partition, each output ($I_{MSB\_m}$) is partitioned into at least two pre-calibration outputs ($I_{CUT\_m0,1}$), and each pre-calibration output satisfies the following equation:

$$I_{CUT\_m0,1} \leq \Sigma_{k=0}^{N-1} I_k$$

wherein $\Sigma_{k=0}^{N-1} I_k$ is the maximum reference output generated by N pieces of the reference conversion cell groups, and $I_0$ is the least weight output of the conversion cells. $\Delta I_{CUT\_m0,1}$ is the difference between the actual and ideal values of the pre-calibration output ($I_{CUT\_m0,1}$). $\Delta I_{CUT\_m0,1}$ absolutely smaller than 0. Thereby, the reference output $\Sigma_{k=0}^{N-1} d_k I_k$ provided by N pieces of conversion cells is sufficient to estimate the actual digital weights of the pre-calibration outputs, wherein $d_k$ is the digital control signal of the reference group.

Another objective of the present invention is to provide a weight error calibration method for a DAC circuit, which cooperates with the abovementioned DAC circuit, and which can reduce the area and complexity of the calibration circuits.

In one embodiment, the weight error calibration method for a DAC circuit is used to calibrate the outputs of the pre-calibration conversion cell groups in the abovementioned DAC circuit and comprises the following steps: using the actual weight table stored in the calibration memory to modify the digital control signals of the conversion cells; using the modified digital control signals of the pre-calibration conversion cell groups and the reference conversion cell groups to drive the conversion cells to generate the calibrated outputs of the DAC circuit, and calibrating the output errors of the (P-A) unknown weight conversion cells.

A DAC circuit is normally composed of a set of cells respectively having different weights. The precision of the DAC circuit depends on the accuracy of the proportions of the weights of the cells. Therefore, the present invention proposes a DAC circuit and a weight error estimation/calibration method thereof, which dynamically partitions the higher weight cells and uses the LSB cells of the original DAC circuit to estimate the weight errors of the higher weight cells and obtain the digital errors thereof, only using few additional circuits. The results obtained by the method of the present invention can be used to calibrate the weight proportions of a DAC circuit and enhance the precision thereof. Compared with the prior arts, the present invention has the following advantages:

1. The present invention effectively reduces circuit area and design complexity.
2. The present invention does not need replicate LSB cells but reuses the LSB cells of the original circuit as the reference group. Therefore, the present invention is exempted from the mismatch between the replicate LSB cells and the LSB cells of the original circuit.
3. The present invention can decrease the weight errors caused by process variations and thus can enhance the yield and performance of DAC circuits.

BRIEF DESCRIPTION OF THE DRAWINGS

To make easily understood the objectives, characteristics, and advantages of the present invention, embodiments are described in detail in cooperation with drawings, which are briefly outlined below.

FIG. 8 schematically shows the partition of the currents of the high weight current source cells in FIG. 6.

DETAILED DESCRIPTION OF THE INVENTION

The present invention is applicable to various DACs. Conventionally, a 14-bit DAC is realized with 14 pieces of binary-weighted conversion cells ($I_{CS1}$-$I_{CS14}$). The output weights of the conversion cells are increased exponentially with base 2, i.e. $I_{CS2}=2 \times I_{CS1}$, $I_{CS3}=2^2 \times I_{CS1}$, ..., $I_{CS14}=2^{13} \times I_{CS1}$. In practice, the conversion cells having higher weights (such as $I_{CS9}$-$I_{CS14}$) are more likely to have more significant weight errors than the conversion cells having lower weights (such as $I_{CS1}$-$I_{CS8}$) Thus, the weights of conversion cells having higher weights cannot be exactly base-2 exponents. Consequently, the DAC is likely to have poor linearity. Therefore, the present invention undertakes foreground calibration to calibrate the weight error of each DAC conversion cell having a higher weight.

Figure 1:
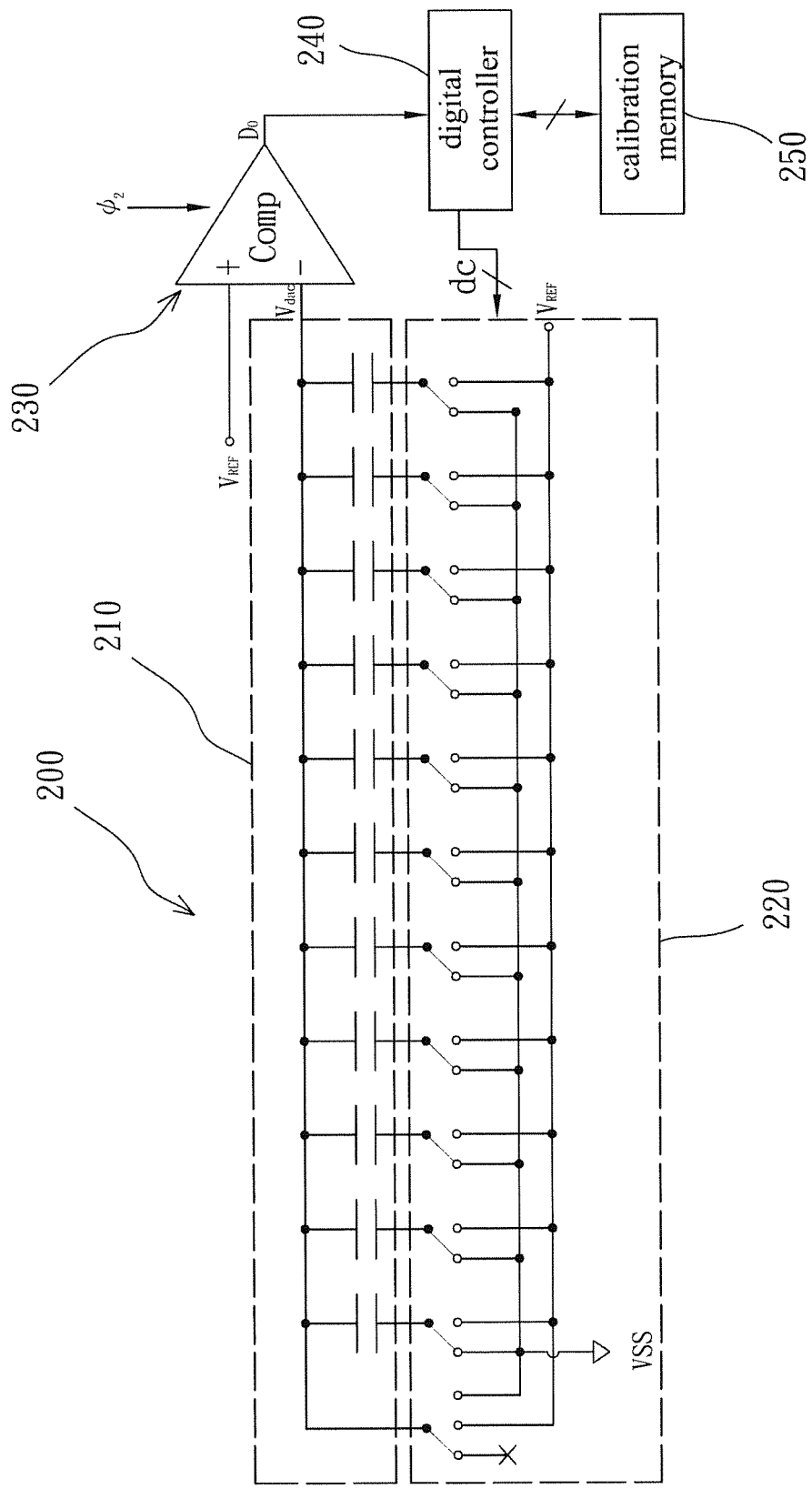
FIG. 1 schematically shows the structure of a DAC circuit 200 according to one embodiment of the present invention.

Herein, a single-ended switched-capacitor type DAC is used to demonstrate the present invention. Refer to FIG. 1, a diagram schematically showing a DAC circuit 200 according to one embodiment of the present invention. The DAC circuit 200 may be partitioned into several interactive blocks according to the functions thereof, comprising P pieces of conversion cells 210, an output switching circuit 220, a comparator 230, a digital controller 240, and a calibration memory 250. The P pieces of conversion cells 210 contains A pieces of known weight conversion cells and (P-A) pieces of unknown weight conversion cells. The output switching circuit 220 includes a plurality of switches. The output switching circuit 220 electrically connects with the P pieces of conversion cells 210 and receives the output of each conversion cell 210. In an error estimation mode, the output switching circuit 220 dynamically selects N pieces of conversion cells as a reference conversion cell group from the P pieces of conversion cells 210 according to the digital control signals of a reference group, wherein the reference conversion cell group at least contains the A pieces of known weight conversion cells and outputs a reference output Ir according to the digital control signals of the reference group. The output switching circuit 220 also dynamically selects at least one unknown weight conversion cell as a pre-calibration conversion cell group from the (P-A) pieces of unknown weight conversion cells according to the digital control signals of a pre-calibration group. The output switching circuit 220 also outputs a pre-calibration output Ic, which must be smaller than the maximum value of the reference output Ir. An ADC digitalizes the difference of the reference output Ir and the pre-calibration output Ic to generate a digital calibration signal Do. Herein, the ADC is exemplified by the comparator 230, which compares the reference output Ir and the pre-calibration output Ic (such as Ir−Ic=Vref−Vdac shown in FIG. 1) to generate the digital calibration signal Do and outputs it to the digital controller 240. The digital controller 240 electrically connects with the comparator 230 and the output switching circuit 220 and generates the digital control signals (dc) of the reference group and the pre-calibration group. After receiving the digital calibration signal Do, the digital controller 240 generates a digital weight output. The digital weight outputs are used to establish a weight table. The digital controller 240 works out the actual weight of each unknown conversion cell according to the weight table. The calibration memory 250 electrically connects with the digital controller 240 and stores the actual weights of the unknown weight conversion cells, which the digital controller 240 works out according to the weight table.

Figure 2:
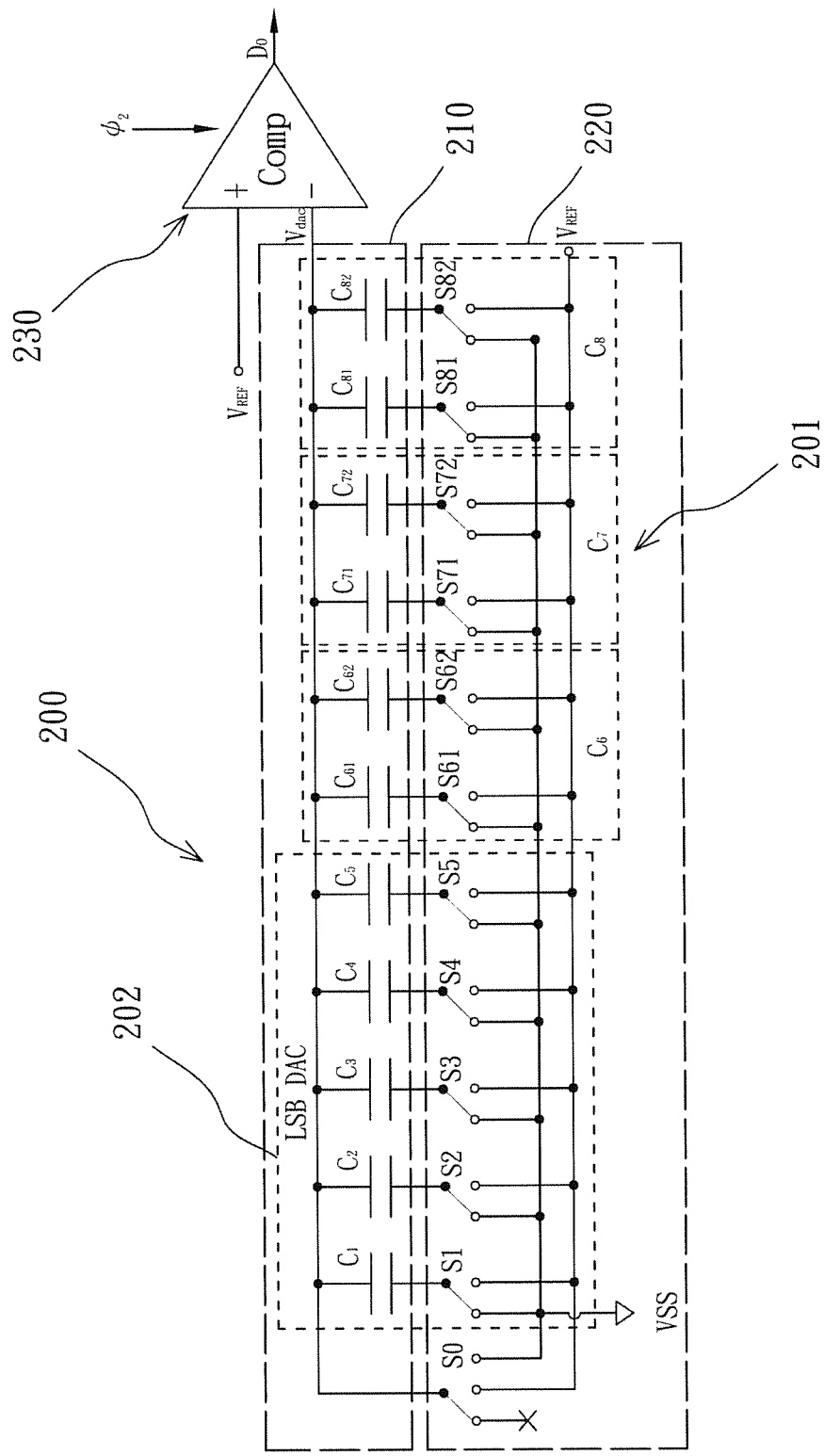
FIG. 2 schematically shows the partition of the conversion cells shown in FIG. 1.

Refer to FIG. 2, a diagram schematically showing the partition of the conversion cells shown in FIG. 1. For simplicity, FIG. 2 only shows the conversion cells 210, output switching circuit 220 and comparator 230, which are involved in the current description. The digital controller 240, which controls a plurality of switches (S0-S82) of the output switching circuit 220, and the calibration memory 250, which stores the calculation results, are not shown in FIG. 2 lest the discussion be out of focus. In FIG. 2, the conversion cells 210 and the output switching circuit 220 are partitioned into a main DAC circuit 201 and an LSB DAC circuit 202. In this embodiment, the weights of the capacitors (C1-C5) of the LSB DAC circuit 202 are preset to be in an ideal state. The main DAC circuit 201 includes capacitors $C_{8x}$-$C_{6x}$. For an example, the weights of the capacitors are as follows: $C_{82}$:$C_{81}$:$C_{72}$:$C_{71}$:$C_{62}$:$C_{61}$:$C_5$:$C_4$:$C_3$:$C_2$:$C_1$=$2^6$:$2^6$:$2^5$:$2^5$:$2^4$:$2^4$:$2^4$:$2^3$:$2^2$:2:1.

Next, this embodiment uses Table.1 to explain how to calibrate the weights. This embodiment adopts a binary-weighted system. Each unknown weight conversion cell functioning as a pre-calibration group is partitioned into two sub-cells having identical nominal weights.

TABLE 1

| Cell | I8 | | I7 | | I6 | | LSB DAC | | | | | Estimated weights | Result |
|---|---|---|---|---|---|---|---|---|---|---|---|---|---|
| Nominal wt. | 128 | | 64 | | 32 | | asssumed to have ideal weights | | | | | Once the weight of a sub-cell is estimated, this sub-cell can be used to estimate the sub-cells with higher weights. | |
| Real wt. | 158 | | 66 | | 39 | | | | | | | | |
| Sub-cell | I8_2 | I8_1 | I7_2 | I7_1 | I6_2 | I6_1 | I5 | I4 | I3 | I2 | I1 | | |
| Nominal wt. | 64 | 64 | 32 | 32 | 16 | 16 | 16 | 8 | 4 | 2 | 1 | | |
| real wt. | 108 | 50 | 42 | 24 | 30 | 9 | 16 | 8 | 4 | 2 | 1 | | |
| Step 1, SA 1 | Ar. | Ar. | Ar. | Ar. | Ar. | Ic = 9 | 1 | 0 | 0 | 0 | 0 | Do = 0 | wt. ≤ 16 |
| Step 1, SA 2 | Ar. | Ar. | Ar. | Ar. | Ar. | Ic = 9 | 0 | 1 | 0 | 0 | 0 | Do = 1 | wt. > 8 |
| Step 1, SA 3 | Ar. | Ar. | Ar. | Ar. | Ar. | Ic = 9 | 0 | 1 | 1 | 0 | 0 | Do = 0 | wt. ≤ 12 |
| Step 1, SA 4 | Ar. | Ar. | Ar. | Ar. | Ar. | Ic = 9 | 0 | 1 | 0 | 1 | 0 | Do = 0 | wt. ≤ 10 |
| Step 1, SA 5 | Ar. | Ar. | Ar. | Ar. | Ar. | Ic = 9 | 0 | 1 | 0 | 0 | 1 | Do = 1 | wt. = 9 |
| Step 1: estimating I6_1 wt.* | Ar.** | Ar. | Ar. | Ar. | Ar. | Ic = 9 | 0 | 1 | 0 | 0 | 1 | Dw(I6_1) = (01001) = 9 | |
| Step 2: estimating I6_2 wt. | Ar. | Ar. | Ar. | Ar. | Ic = 30 | Ar. | 1 | 1 | 1 | 1 | 0 | Dw(I6_2) = 30 | I6 = 9 + 30 = 39 |
| Step 3: estimating I7_1 wt. | Ar. | Ar. | Ar. | Ic = 24 | | 0 | 1 | 1 | 0 | 0 | 0 | Dw(I7_1) = 0*I6 + (11000) = 24 | |
| Step 4: estimating I7_2 wt. | Ar. | Ar. | Ic = 42 | Ar. | | 1 | 0 | 0 | 0 | 1 | 1 | Dw(I7_2) = 1*I6 + (00011) = 42 | I7 = 42 + 24 = 66 |
| Step 5: estimating I8_1 wt. | unused | Ic = 50 | | 0 | | 1 | 0 | 1 | 0 | 0 | 0 | Dw(I8_1) = 0*I7 + 1*I6 + (01000) = 50 | |

TABLE 1-continued

|  |  |  |  |  | LSB DAC |  |  |  |  | Estimated weights | Result |
| --- | --- | --- | --- | --- | --- | --- | --- | --- | --- | --- | --- |
| Step 6: estimating I8__2 wt. | Ic = 108 | Ar. | 1 | 1 | 0 | 0 | 0 | 1 | 1 | Dw(I8__2) = 1*I7 + 1*I6 + (00011) = 108 | I8 = 50 + 108 = 158 |

*wt. = weight
**Ar. = arbitrary

In other words, each bit of the main DAC circuit 201 is formed by two capacitors. The ith bit controls an equivalent capacitor weighted $2^{i-1}$. The output of the DAC circuit 200 is Vdac. In this embodiment, the DAC circuit 200 is a switched-capacitor type DAC, which does not generate the pre-calibration output Ic and the reference output Ir at the same time. The Ic-Ir signals at the Vdac node are generated in the two following steps, which are also used to estimate the weights of the capacitors:

Step 1: pre-charging the capacitor array; and
Step 2: using a successive approximation method to undertake the bit cycling of each bit from the high bit to the low bit until Vdac=VREF.

The bit cycling is shown in Table.1. If the "arbitrary" is filled in a field, it means that the corresponding cell takes or does not take part in bit cycling. The switches S0-S82 receive the control signals and generate the differences of pre-calibration currents Ic and reference currents Ir at Vdac. The comparator 230 receives the difference to determine the digital calibration signal Do. In fact, the circuit shown in FIG. 2 can be regarded as an SAR (Successive Approximation Register) ADC. The practical capacitor estimation process is as follows:

According to the charge conservation principle, the SAR ADC circuit has the following transfer function:

$$\frac{V_{dac}}{V_{REF}} = \frac{C_{out}}{C_T} - \frac{C_{prc}}{C_T} + \frac{V_{ip}}{V_{REF}} \quad (1)$$

wherein $C_{prc}$, is the sum of the capacitances connected to $V_{REF}$ in the pre-charge state of Step 1; $C_{out}$ is the sum of the capacitances connected to $V_{REF}$ after the bit cycling in Step 2; $C_T$ is the sum of the capacitances connected to $V_{dac}$, $$V_{dac} = \sum_i C_i;$$

and $V_{ip}$ is the pre-charge voltage.

In an estimation mode, $C_{prc}=C_{UT}$, and $V_{ip}=V_{REF}$, wherein $C_{UT}$ is the sum of the capacitances of the pre-estimation cells. After the bit cycling, $V_{dac}$ approximates $V_{REF}$. From Equation (1), Equation (2) can be obtained:

$$\frac{C_{UT}}{C_T} = \frac{C_{out}}{C_T} = \sum_i d_i W_i \quad (2)$$

If the weights $W_i$ of the capacitors taking part in the bit cycling are known, the present invention can use the obtained $d_i$ to work out the actual weight of the pre-estimation total capacitance.

Figure 3A:
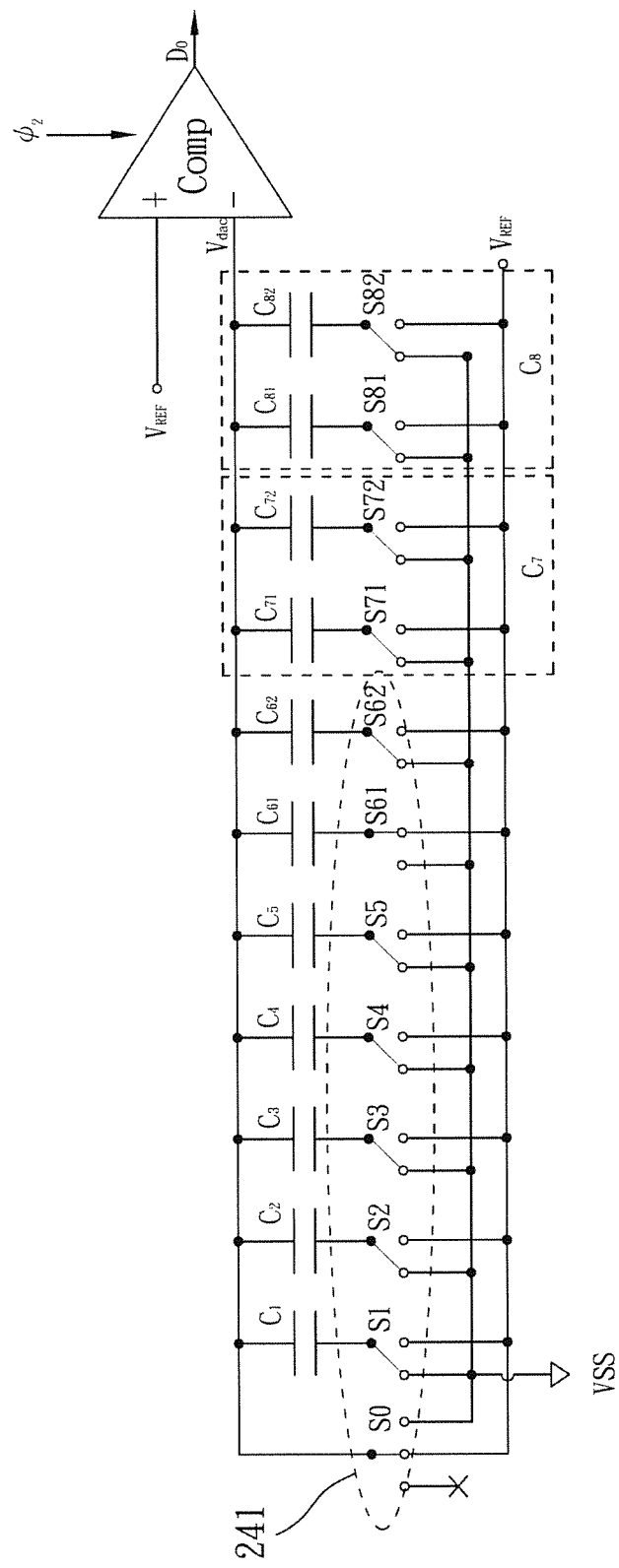
FIGS. 3A-3H schematically show the operation of the DAC circuit 200 shown in FIG. 2.
Figure 3B:
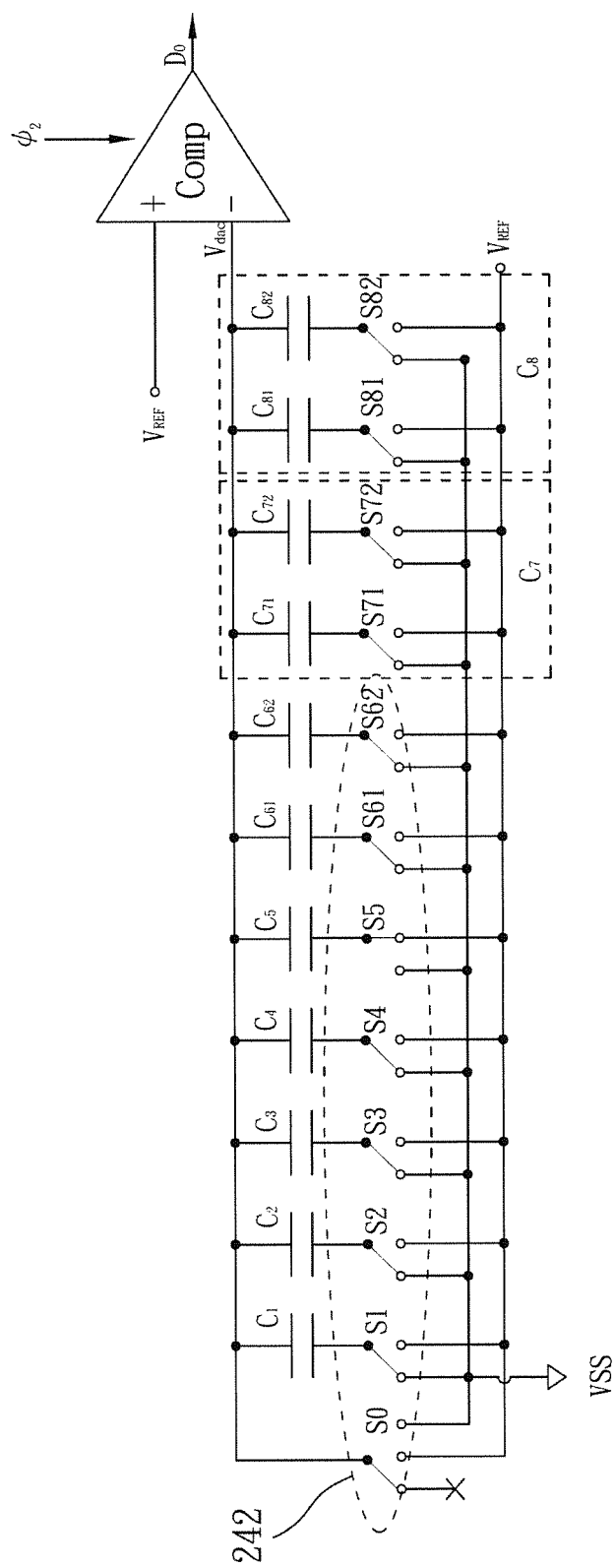

The abovementioned equations may seem somewhat complicated. Therefore, refer to FIGS. 3A-3H diagrams schematically showing the operation of the DAC circuit 200 shown in FIG. 2. In FIG. 3A, $V_{dac}=V_{REF}$, and $Q_{dac}=(C_T-C_{61})V_{REF}$. In this embodiment, let $I_C=C_{61}V_{REF}$, as the switch status 241 shown in FIG. 3A. According to the charge conservation principle, $Q_{dac}=(C_T-C_{61})V_{REF}=(C_T-C_5)V_{dac}$, as shown in FIG. 3B. Suppose that all the capacitor weights are those shown in Table.1. Thus, the input of the comparator 230 is $$V_{dac} = \frac{C_T - C_{61}}{C_T - C_5} V_{REF} < V_{REF},$$

then Do=0. In other words, there is a sub-step setting $I_r=C_5V_{REF}$ as the switch status 242 shown in FIG. 3B.

Figure 3C:
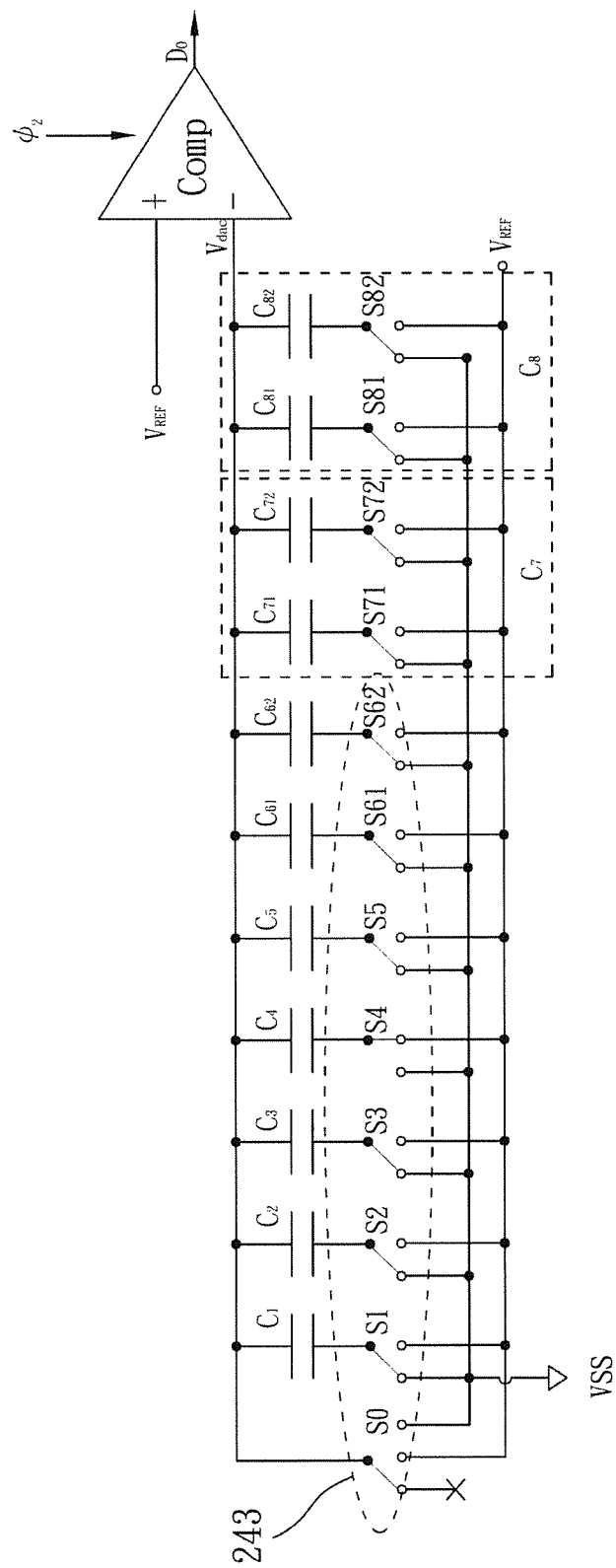
Figure 3D:
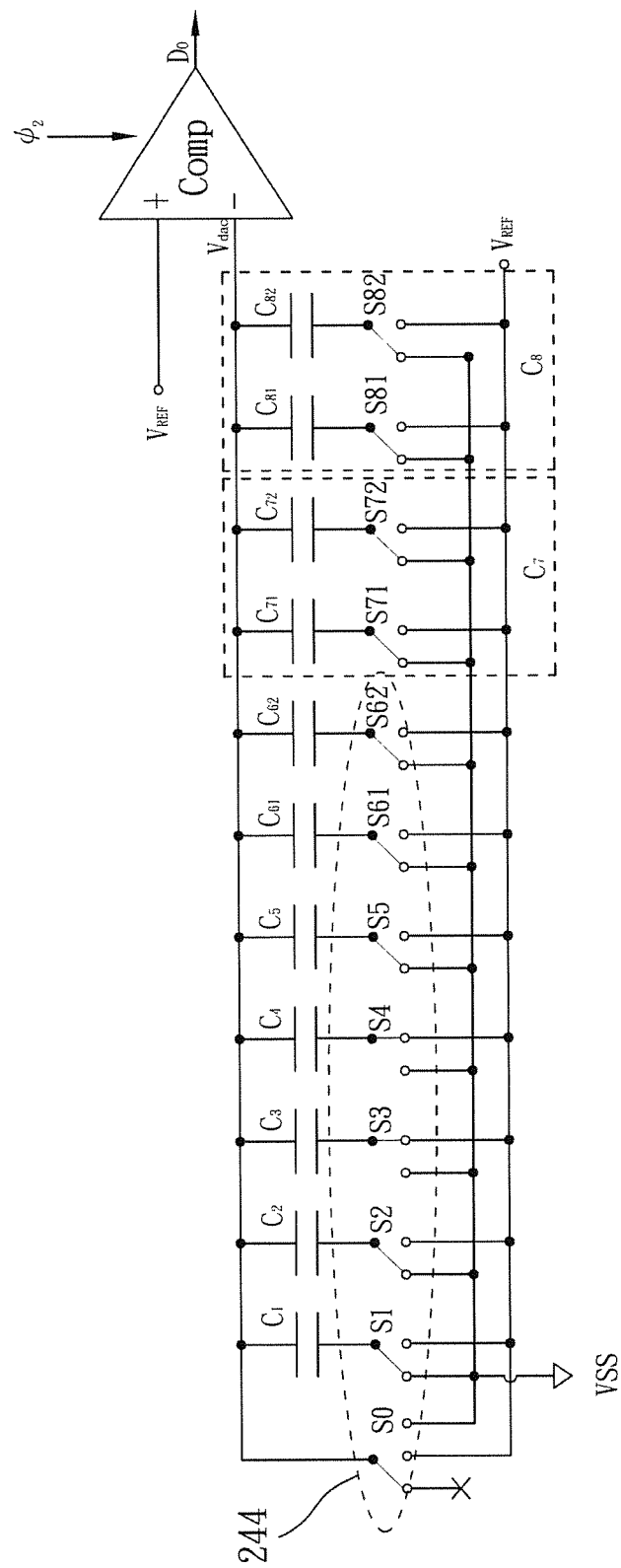
Figure 3E:
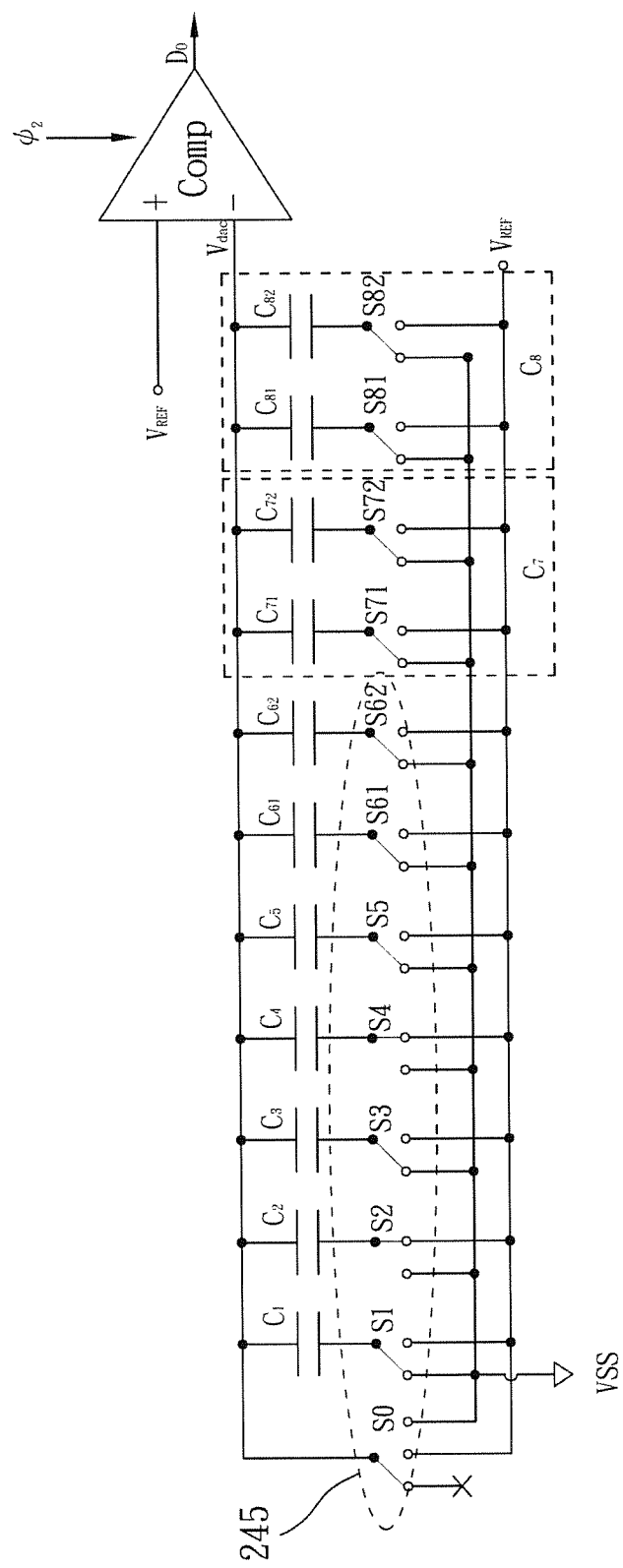
Figure 3F:
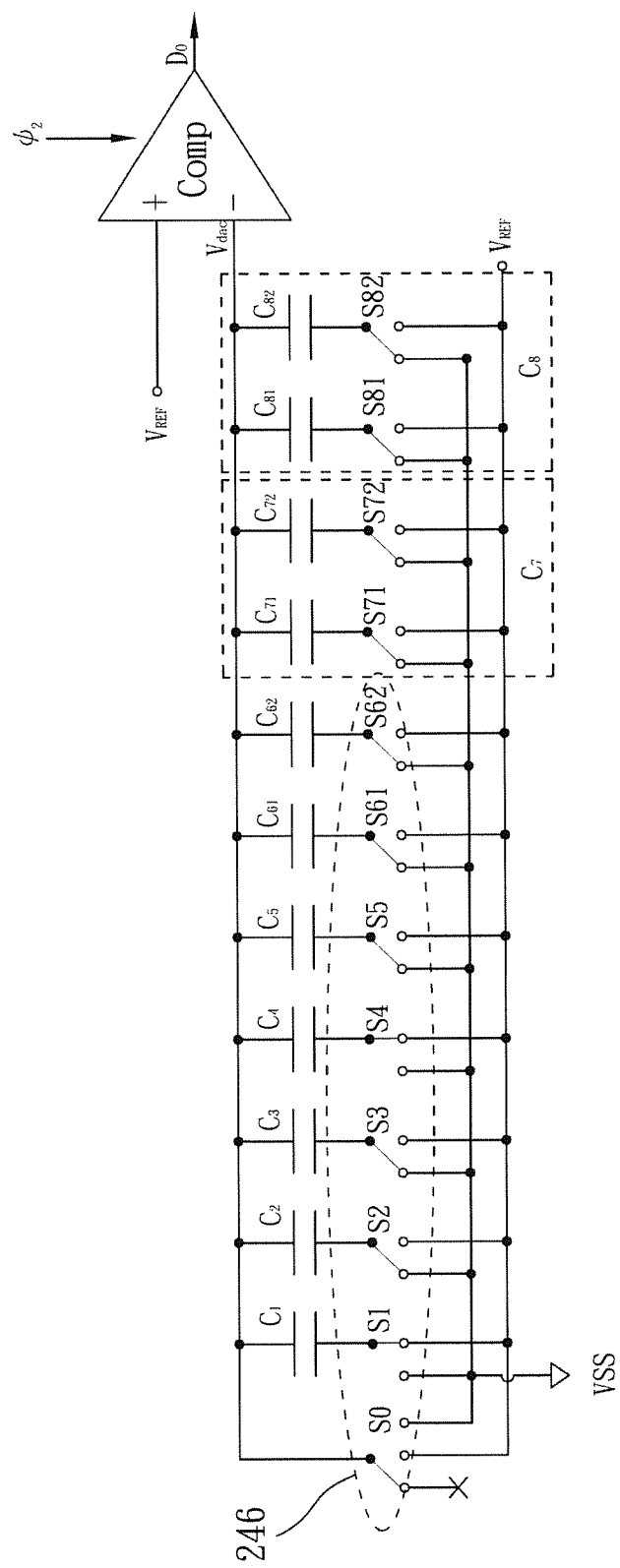
Figure 3G:
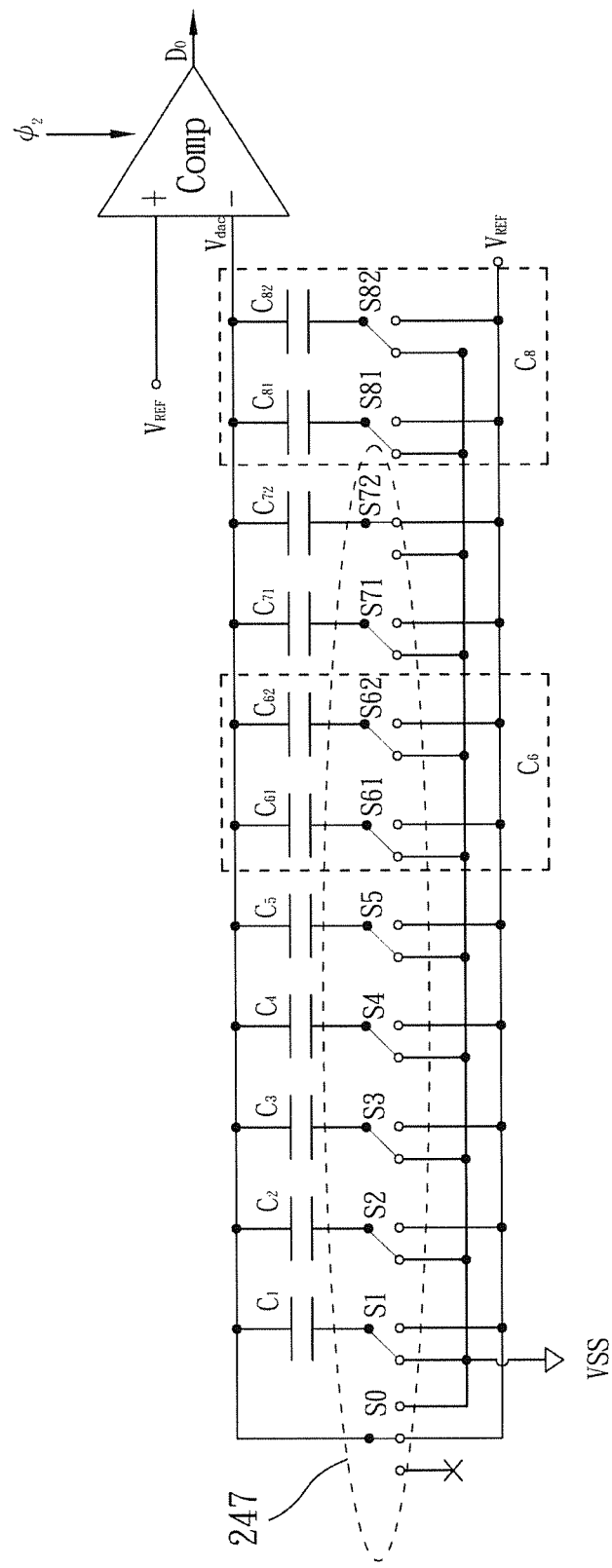

In FIG. 3C, $Q_{dac}=(C_T-C_{61})V_{REF}=(C_T+0 \cdot C_5-C_4)V_{dac}$. Thus, $$V_{dac} = \frac{C_T - C_{61}}{C_T - C_4} V_{REF}.$$

Therefore, there is a sub-step setting $I_r=(0 \cdot C_5+1 \cdot C_4)V_{REF}$, as the switch status 243 shown in FIG. 3C. Next, as the switch statuses 244, 245 and 246 respectively shown in FIGS. 3D-3F, $I_r=(0 \cdot C_5+1 \cdot C_4+0 \cdot C_3+0 \cdot C_2+1 \cdot C_1)V_{REF}$ in each sub-step. After the bit cycling, $I_r=I_C$, and $V_{dac} \rightarrow V_{REF}$. Besides, $I_r=(C_4+C_1)V_{REF}=I_C=C_{61}V_{REF}$. Therefore, $C_{61}=C_4+C_1$. Thus, as shown in Table.1, the actual weight of the pre-estimation sub-cell I6__1 of the conversion cell I6 is equal to the sum of the actual weights of the sub-cell I4 and I1 of the LSB DAC 202, i.e. the actual weight of the sub-cell I6__1 is equal to (8+1)=9. Via similar deduction is learned that the actual weight of the sub-cell I6__2 is 30.

Figure 3H:
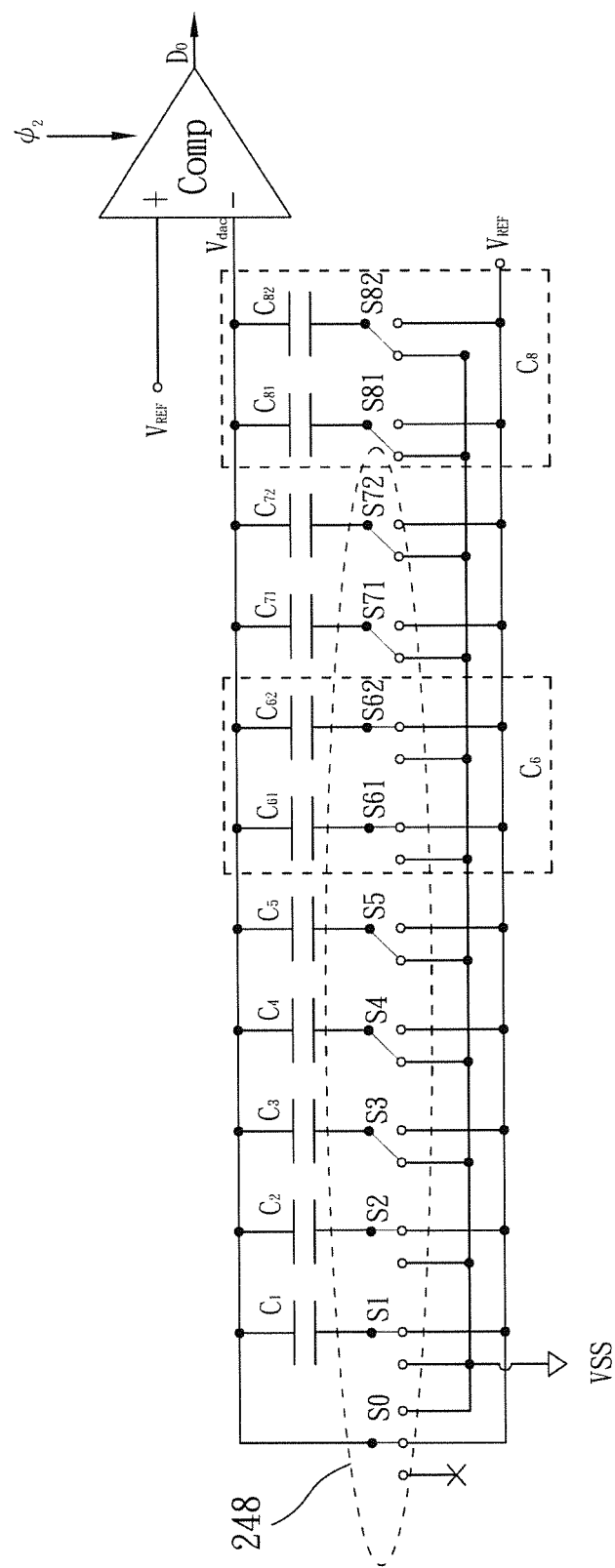

As to the MSB weight estimation, this embodiment performs it from LSB's ($C_{61}$ and $C_{62}$) to MSB's ($C_{81}$ and $C_{82}$). Once the weights of $C_{61}$ and $C_{62}$ have been estimated, $C_{61}$ and $C_{62}$ are regarded as an integral $C_6$ and may also be regarded as a member of the reference conversion cell group in the succeeding estimations. Next, refer to FIG. 3G and FIG. 3H diagrams schematically showing the estimation of $C_{72}$. In the pre-charge of Step 1, $V_{dac}=V_{REF}$, and $Q_{dac}=(C_T-C_{72})V_{REF}$. In other words, there is a sub-step setting $I_C=C_{72}V_{REF}$, as the switch status 247 shown in FIG. 3G. In FIG. 3H, after the bit cycling of Step 2, there is a sub-step setting $I_r=(1 \cdot C_6+0 \cdot C_5+0 \cdot C_4+0 \cdot C_3+1 \cdot C_2+1 \cdot C_1)V_{REF}$, as the switch status 248. Then, $I_r=I_C$, and $V_{dac} \rightarrow V_{REF}$. Therefore, $C_{72}=C_6+C_2+C_1$.

The influence of the offset Vos of the comparator 230 itself may be calibrated as follows: firstly, set all the switches (S0-S82) to be zero; next, undertake the bit cycling to output the value of Vos/Vref. Let an arbitrary switch be 1, and undertake the pre-charge and the bit cycling. The output will be Wx−(Vos/Vref). Thereby the influence of the offset Vos of the comparator 230 can be calibrated.

The method for estimating the actual weight of the pre-calibration output (Ic) of the DAC circuit 200 may be roughly arranged into the following steps:

Step 1: select M pieces of pre-calibration groups to generate M pieces of different pre-calibration outputs (Ic), wherein M is greater than or equal to (P-A).

Step 2: use a successive approximation method to estimate each pre-calibration output (Ic), and control the reference output (Ir) via varying the digital control signal of the reference group to make the reference output (Ir) approximate the pre-calibration output (Ic) successively and work out the digital weight output of the pre-calibration output (Ic).

Step 3: use the digital weight outputs of the pre-calibration outputs (Ic) to establish a weight table; repeat the above-mentioned steps until the digital controller 240 can work out the actual digital weights of all the unknown weight conversion cells, and stores the actual digital weights in the calibration memory 250.

Correspondingly, the method for calibrating the pre-calibration output (Ic) of the DAC circuit 200 may be roughly arranged into the following steps:

Step 1: modify the digital control signals of the conversion cells 210 according to the actual weight table stored in the calibration memory 250.

Step 2: use the modified digital control signals of the pre-calibration groups and the reference groups to drive the conversion cells 210 to generate calibrated outputs of the DAC circuit and calibrate the output errors of the (P-A) pieces of unknown weight conversion cells.

Figure 4:
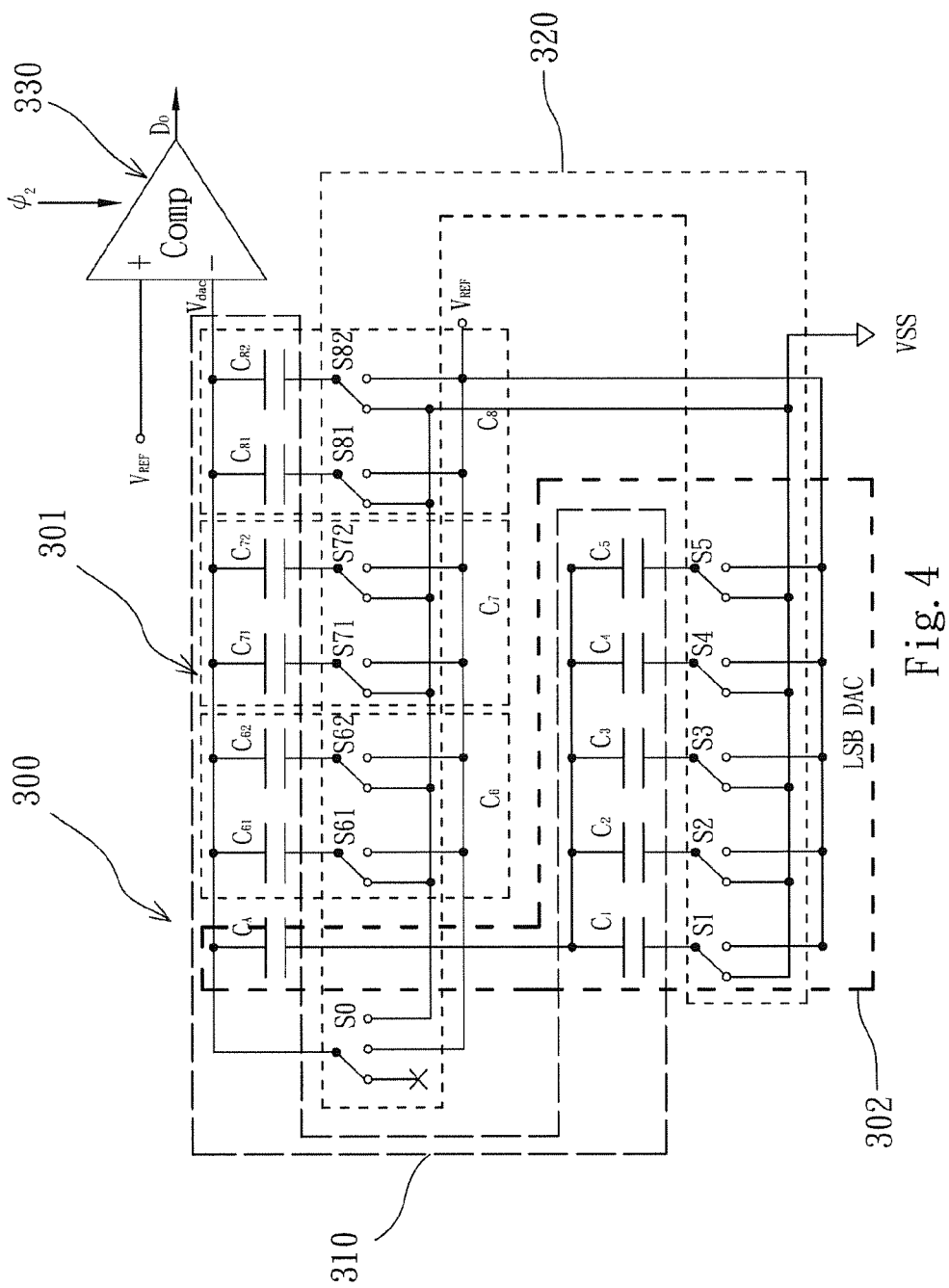
FIG. 4 schematically shows the structure of a DAC circuit 300 according to another embodiment of the present invention.
Figure 5A:
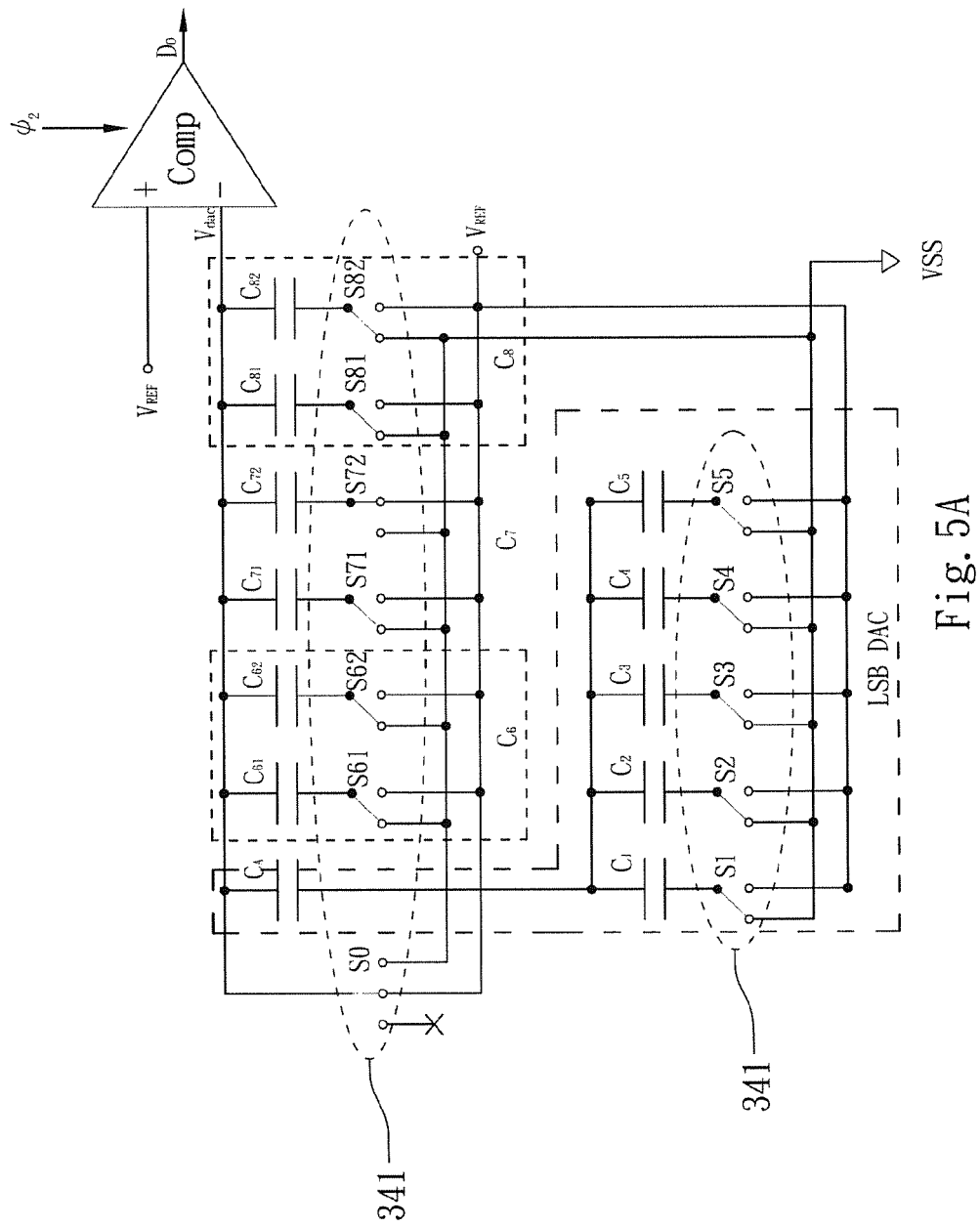
FIG. 5A and FIG. 5B schematically show the operation of the DAC circuit 300 shown in FIG. 4.
Figure 5B:
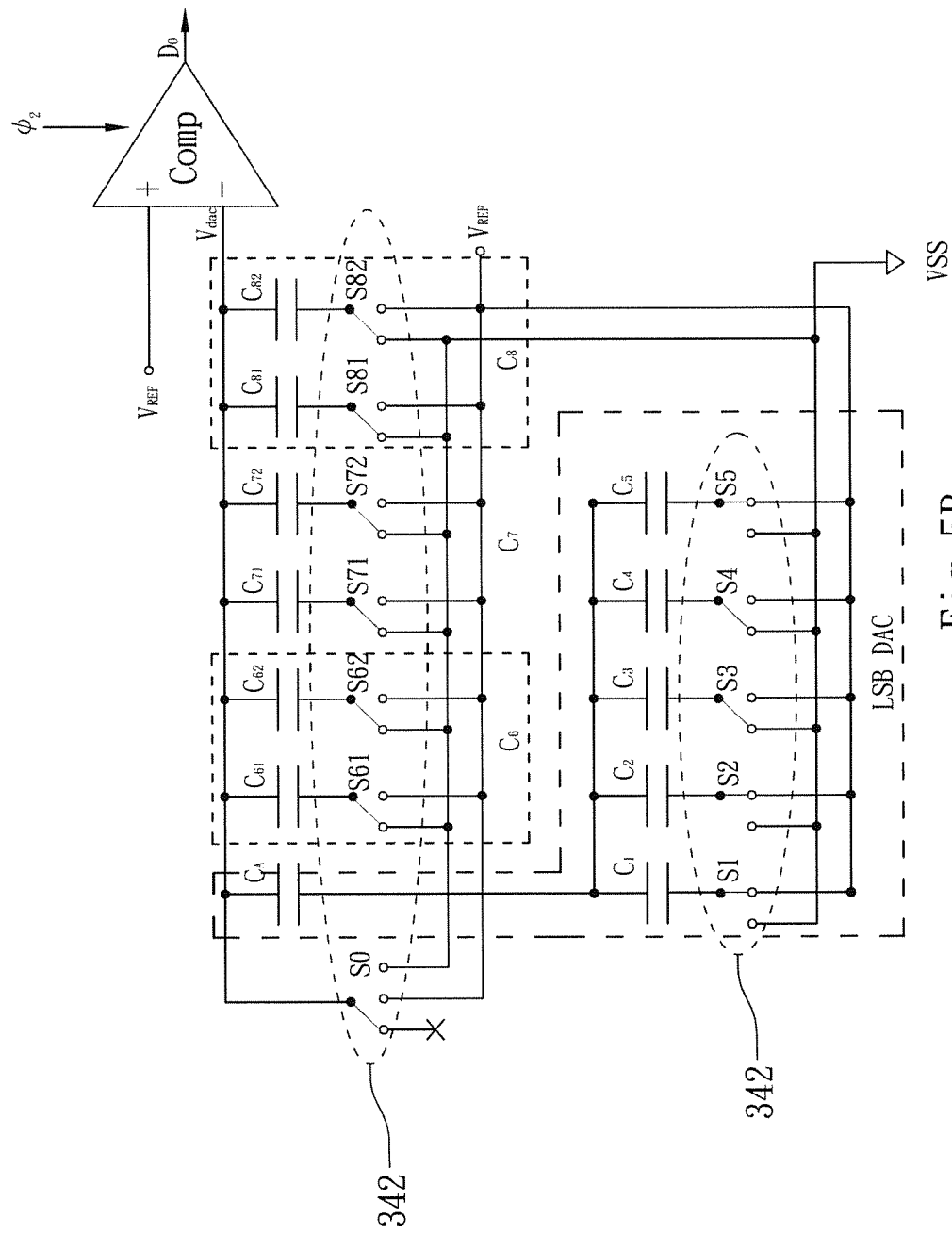

Refer to FIG. 4, a diagram schematically showing a DAC circuit 300 according to another embodiment of the present invention. For simplicity, only conversion cells 310, an output switching circuit 320 and a comparator 330 are shown in FIG. 4. The digital controller 240, which controls a plurality of switches (S0-S82) of the output switching circuit 220, and the calibration memory 250, which stores the calculation results, have been depicted in FIG. 1 and are not shown in FIG. 4 lest the discussion be out of focus. In FIG. 4, the conversion cells 310 and the output switching circuit 320 are partitioned into a main DAC circuit 301 and an LSB DAC circuit 302. The DAC circuit 300 is different from the DAC circuit 200 in that an attenuation-type capacitor $C_A$ is used to realize the LSB DAC circuit 302. Nominally, $C_{82}:C_{81}:C_{72}:C_{71}:C_{62}:C_{61}:C_A: C_5:C_4:C_3:C_2:C_1 = 2^2:2^2:2^1:2^1:1:1:2:2^4:2^3:2^2:2^1:1$. For practical operations, refer to FIG. 5A and FIG. 5B respectively a diagram schematically showing the pre-charge of the DAC circuit 300 and a diagram schematically showing the bit recycling of the DAC circuit 300. The switch status 341 of the pre-charge step and the switch status 342 of the bit cycling step have been described in detail hereinbefore and will not repeat herein.

Figure 6:
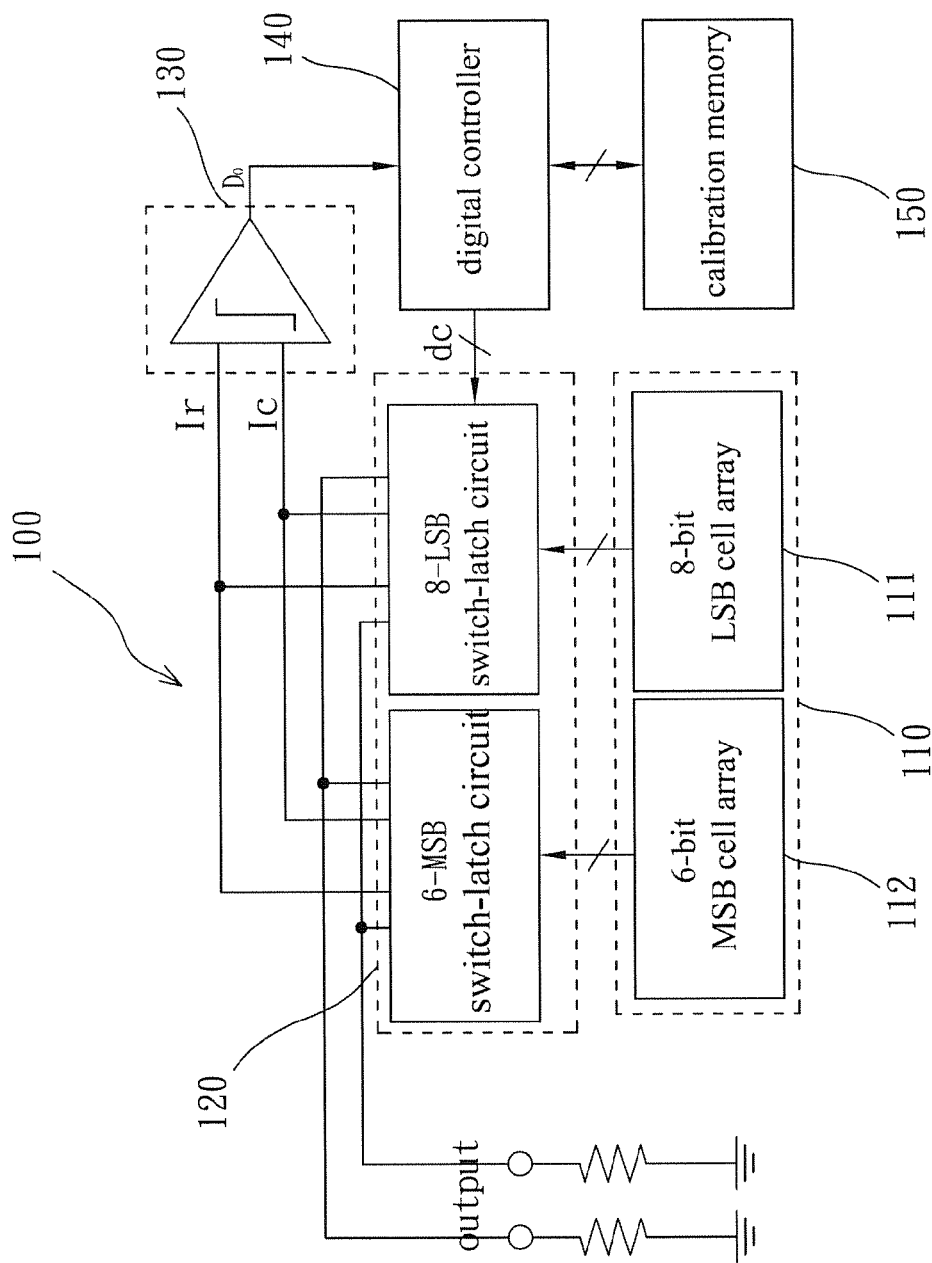
FIG. 6 schematically shows the structure of a DAC circuit 100 according to yet another embodiment of the present invention.

The abovementioned DAC circuits 200 and 300 are single-ended switched-capacitor-type DACs. The present invention can also be used to calibrate fully-differential switched-capacitor-type DACs. The steps for calibrating fully-differential switched-capacitor-type DACs are similar to those for single-ended switched-capacitor-type DACs and will not repeat herein. The present invention can also be applied to current-type DACs. Refer to FIG. 6, a diagram schematically showing a DAC circuit 100 according to yet another embodiment of the present invention. The major difference between the DAC circuit 100 and the DAC circuit 200 shown in FIG. 1 is that the DAC circuit 200 generates the pre-calibration output (Ic) and the reference output (Ir) simultaneously and the DAC circuit 100 generates them separately.

As shown in FIG. 6, the DAC circuit 100 comprises P pieces of conversion cells 110, an output switching circuit 120, a comparator 130, a digital controller 140, and a calibration memory 150. The design methodology can select transistors of appropriate size to make ENOB (Effective Number of Bit) of a DAC reach over 8 bits. To avoid the complicated computation and the costly hardware overhead due to calibration, the LSB cell array 111, composed of the low-weighted conversion cells from the P pieces of conversion cells 110 in the DAC circuit 100, is designed to be 8-bit with nonlinear errors smaller than half of the output of the least-weighted current source cell ($I_{LSB\_1}$). All the current source cells ($I_{LSB\_n}$) of the LSB cell array 111 have an ideal weight distribution, which is based on a binary exponent system and similar to that of the currents $I_{CS1} \sim I_{CS8}$ of the current source cells of the conventional DAC, i.e. $I_{LSB\_2}=2 \times I_{LSB\_1}$, $I_{LSB\_3}=2^2 \times I_{LSB\_1}, \ldots, I_{LSB\_8}=2^7 \times I_{LSB\_1}$. Further, the high weight current source cells of the P pieces of conversion cells 110 are designed to be a 6-bit MSB cell array 112. All the current source cells ($I_{MSB\_m}$) of the 6-bit MSB cell array 112 have an identical weight, i.e. $I_{MSB\_1}=I_{MSB\_2}=\cdots=I_{MSB\_128}$, and all the current source cells $I_{MSB\_m}=I_{LSB\_8}$. All the current source cells ($I_{MSB\_m}$) of the 6-bit MSB cell array 112 are operated in a thermometer coded method. This embodiment is not to limit the present invention but only to exemplify the present invention. The partitions of the bits of the high weight and low weight current source cells, which are made by the users themselves, are still within the scope of the present invention.

The operations of the DAC circuit 100 are also respectively undertaken in the weight error estimation mode and the output calibration mode. In the error estimation mode, the digital controller 140 generates digital current source switch control signals (dc) to control the low weight current source cells ($I_{LSB\_1}-I_{LSB\_8}$), i.e. the 8-bit LSB cell array 111 in FIG. 6. Next, the digital controller 140 uses a successive approximation method is used to estimate the digital weight errors ($D_{MSB\_m}$) of the high weight current source cells ($I_{MSB\_m}$), i.e. the 6-bit MSB cell array 112 in FIG. 6. Next, the estimation results are stored in the calibration memory 150. In the output calibration mode, the DAC circuit 100 uses the estimated weight errors ($D_{MSB\_m}$) to modify the digital current source switch control signals (dc) and then outputs analog signals having correct weights.

Figure 7A:
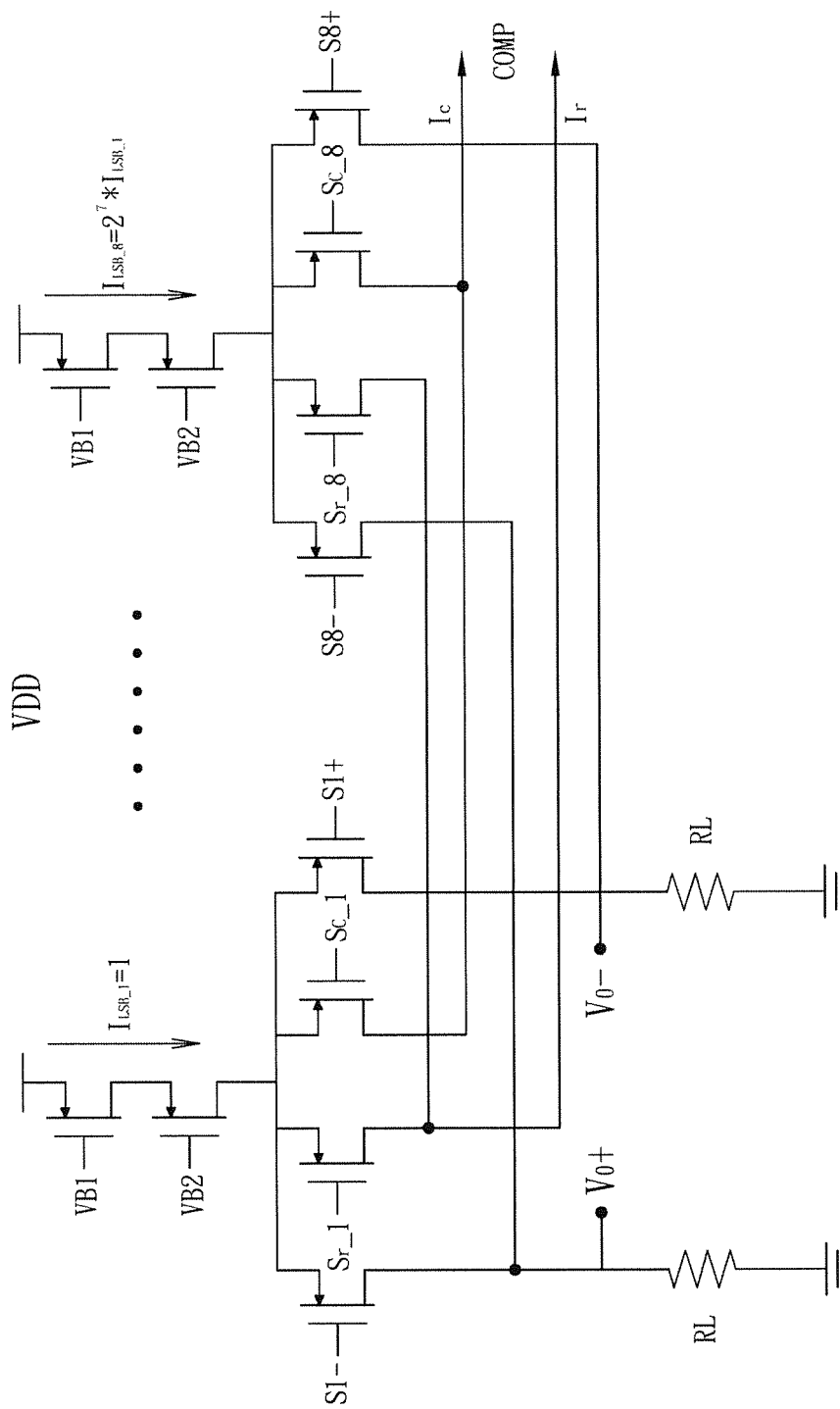
FIG. 7A schematically shows the structure of the LSB cell array 111 shown in FIG. 6
Figure 7B:
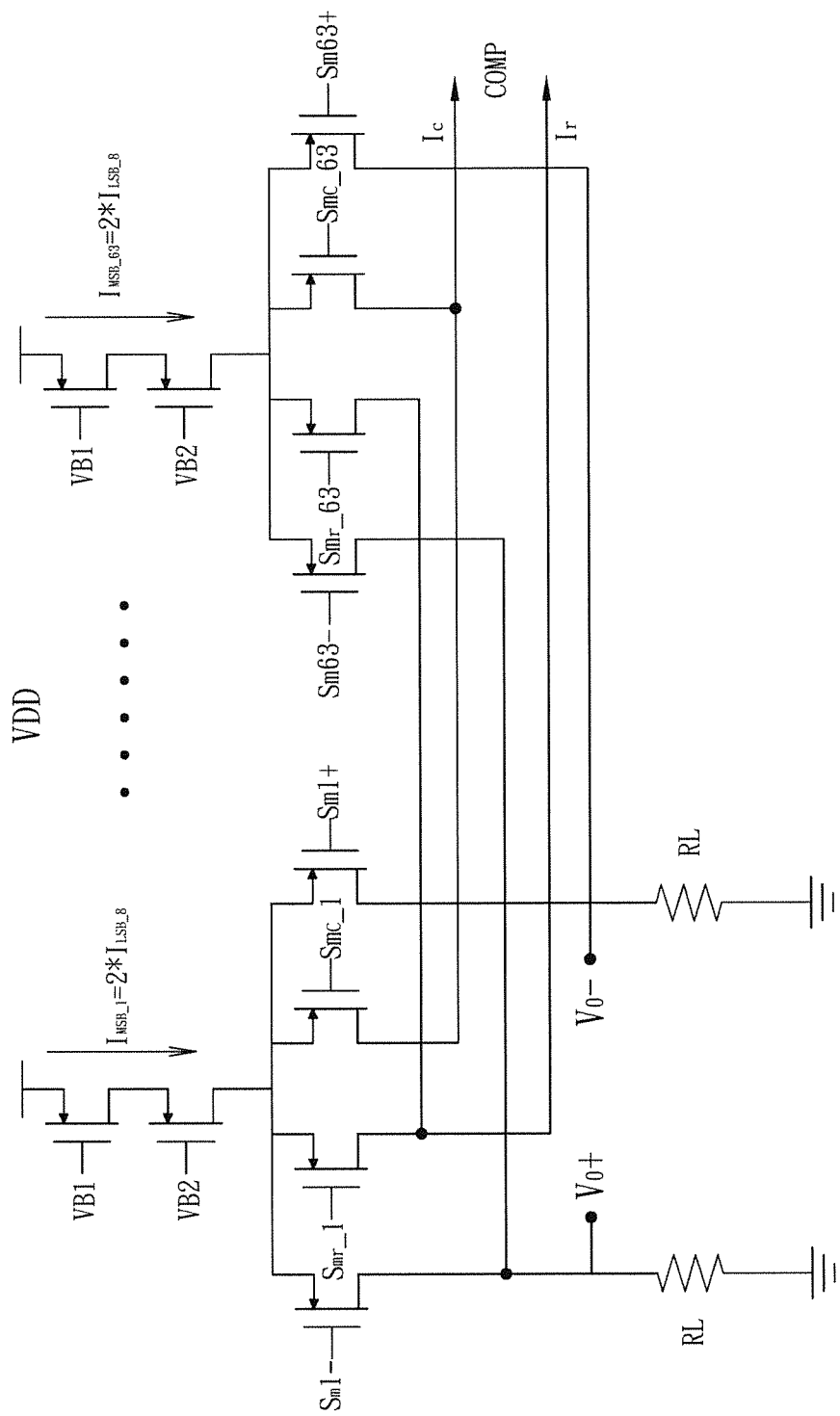
FIG. 7B schematically shows the structure of the MSB cell array 112 shown in FIG. 6.

The details of this embodiment are further described below. Refer to FIG. 7A and FIG. 7B diagrams schematically showing the structures of the 8-bit LSB cell array 111 and the 6-bit MSB cell array 112 shown in FIG. 6. The weight error estimation method for each high weight current source cell ($I_{MSB\_m}$) is as follows. Firstly, the DAC circuit 100 controls the current direction of the specified current source cells of the DAC circuit 100 to generate the current error ($\Delta I$) between the reference current (Ir) of the reference current source cells and the pre-calibration current (Ic) of the pre-calibration current source cells. In this embodiment, the reference current source cells are the low weight current source cells ($I_{LSB\_1} \sim I_{LSB\_8}$); the pre-calibration current source cell is an arbitrary high weight current source cell ($I_{MSB\_m}$). Next, the current comparator 130 converts the current error into a digital signal (Do). Next, the digital controller 140 receives and processes the digital signal (Do), and uses a successive approximation method to make the reference current (Ir) approximate to the pre-calibration current (Ic) and obtain an actual ratio of the pre-calibration current source ($I_{MSB\_m}$) to the unit current $I_0$ ($I_0=I_{LSB\_1}$) Next, the results are stored in the calibration memory 150. Thereby, the DAC circuit 100 can use the obtained actual ratios to calibrate the outputs in the output calibration mode.

The prior arts, such as the "DAC variation-tracking calibration" technology disclosed in the U.S. Pat. No. 7,893,853 and the "14-bit 100 MS/s Digitally Calibrated Binary- Weighted Current-Steering CMOS DAC without Calibration ADC" published in an IEEE paper, would use an additional set of ideal reference current sources as the standard to calibrate the ratio of the high weight current source and the reference current source, presuming that none error exists in the weight ratio of the reference current source cell and the low weight current source cell. Under such a presumption, the maximum magnitude of calibration is equal to the sum of the increased currents of the reference current sources. Contrarily, the present invention uses the low weight current source cells ($I_{LSB\_1} \sim I_{LSB\_8}$) of the DAC circuit itself as the ideal current sources. Further, the present invention undertakes calibration according to the control signals of the digital circuit. Thereby, the present invention can guarantee the correctness of the ratios of the weights of the high weight current source cells ($I_{MSB\_m}$ and the low weight current source cells ($I_{LSB\_1}$-$I_{LSB\_8}$), neither using any additional current source nor suffering the mismatch caused by the additional circuit. Furthermore, the present invention can reduce the hardware area and increase the calibration range. The fundamental reason of the difference between the conventional technology and the present invention is that the maximum magnitude of calibration is equal to the sum of the increased currents of the reference current sources in the conventional technology and the greatest calibration magnitude of the output error is equal to the output of a high weight current source ($I_{MSB\_m}$) in the present invention.

For a further detailed description, refer to FIG. 8, a diagram schematically showing the partition of the currents of the P pieces of conversion cells 110 in FIG. 6. In order that the DAC circuit can self-calibrate without using any additional current source, this embodiment partitions each pre-calibration high weight current source ($I_{MSB\_m}$) in a particular way lest the current of the pre-calibration current source cell be greater than the sum of the currents of the low weight current source cells ($I_{LSB\_1} \sim I_{LSB\_8}$) and exceed the calibration range, as shown in FIG. 8. Table.2 shows an example of the operation of the DAC circuit of the present invention.

TABLE 2

|  | Ics4 ($I_{MSB\_1}$) | Ics3 ($I_{LSB\_3}$) | Ics2 ($I_{LSB\_2}$) | Ics1 ($I_{LSB\_1}$) | $I_0$ |
|---|---|---|---|---|---|
| Ideal ratio | 8 | 4 | 2 | 1 | 1 |
| Presume that the error of the pre-calibration high weight current cell ($I_{MSB\_1}$) $\Delta I_1 = -2I_0$ | 6 | 4 | 2 | 1 | 1 |
| Estimated digital weight of $I_{MSB\_1}$ when $\Delta I_1 = -2I_0$ | O.K. | 1 | 0 | 1 | 1 |
| Presume that the error of the pre-calibration high weight current cell ($I_{MSB\_1}$)$\Delta I_1 = 2I_0$ | 10 | 4 | 2 | 1 | 1 |
| Digitally estimated ratio of $I_{MSB\_1}$ when $\Delta I_1 = 2I_0$ | Fail | 1 | 1 | 1 | 1 |

For an example, the pre-calibration current source cell is partitioned into two identical least pre-calibration current source cells ($I_{CUT}$). The current of the least pre-calibration current source cell ($I_{CUT}$) is equal to the highest-bit-controlled current of the low weight current source cells ($I_{LSB\_1} \sim I_{LSB\_8}$), which is one of the characteristics of this embodiment. Below, this embodiment is further described in detail. As shown in FIG. 8, each pre-calibration high weight current source cell ($I_{MSB\_m}$) is partitioned into two identical least pre-calibration current source cells, including $I_{CUT\_m0}$ and $I_{CUT\_m1}$. In the design of this embodiment, $I_{CUT\_m0}=I_{CUT\_m1}=I_{LSB\_8}$ in an ideal state, whereby the DAC circuit can undertake self-estimation and self-calibration without using additional current source, and whereby is decreased the complexity of the digital circuits and avoided the mismatch between the additional current sources and the output current sources.

The binary weighted system has been mentioned in the prior arts described above. The error estimation technology using the binary weighted system is expressed by Equation (3):

$$I_{CSi} = \sum_{j=1}^{i-1} I_{CSj} + I_0 (I_0 = I_{cs1}) \tag{3}$$

$$I_{CSj} = 2 \times I_{CSj-1}$$

In an ideal state, the output of the current source controlled by the ith bit is equal to the sum of the outputs of the current sources respectively controlled by from the (i−1)th bit to the first bit plus the current of the unit current source ($I_0$). However, the inaccurate weights of the high weight current sources cause current errors. Therefore, Equation (3) is modified as $$I_{CSi} = \sum_{j=1}^{i-1} d_j I_{CSj} + I_0 + \Delta I_i (d_j \in \{0, 1\}) \tag{3}$$

wherein $\Delta I_i$ is the error of $I_{CSi}$. While $\Delta I_i<0$, the magnitude thereof can be estimated via varying the digital signal $d_j$. While $\Delta I_i>0$, an additional current source array is required to compensate the original current source array for the insufficient current and assist in calibration. Otherwise, error would be unlikely to estimate while $\Delta I_i>0$, as shown in Table.2.

In contrast to the abovementioned technology, this embodiment partitions the pre-calibration current source cell, e.g. each high weight current source cell ($I_{MSB\_m}$), in a special way, wherein each output ($I_{MSB\_m}$) is partitioned into at least two smallest pre-calibration outputs ($\tilde{I}_{CL(m,n)}$, n∈{0, 1, ...}), which is expressed by Equation (4):

$$\tilde{I}_{CL(m,n)} = \sum_k d_{k(m,n)} I_{LSB\_k} \le \sum_k I_{LSB\_k} \tag{4}$$

wherein $\Sigma d_{k(m,n)} I_{LSB\_k}$ is the reference output generated by N pieces of reference conversion cell groups, and $d_{k(m,n)}$ are the final digital control signals of the reference conversion cell groups. It is merely via the reference outputs ($I_{LSB\_k}$) provided by N pieces of conversion cells to estimate the digital weight outputs of the pre-calibration outputs. From Equation (4), it is known: this embodiment can guarantee that the low weight current source cells ($I_{LSB\_1} \sim I_{LSB\_8}$) provide sufficient current for error estimation. The actual weight ratio of the smallest pre-calibration output to the low weight current source cells ($I_{LSB\_1} \sim I_{LSB\_8}$) can be estimated by adjusting the digital control signals ($d_{k(m,n)}$ of the low weight current source cells ($I_{LSB\_1} \sim I_{LSB\_8}$) Thereby is not only satisfied the implicit ratio but also increased the calibration range to the half of the original pre-calibration current source ($I_{MSB\_m}$). While an n-bit DAC is partitioned into m-bit high weight current source cells ($I_{MSB}$) and (n-m)-bit low weight current source cells ($I_{LSB}$) and each high weight current source cell ($I_{MSB}$) is partitioned into $I_{CUT\_m0}$ and $I_{CUT\_M1}$ in the above-mentioned way, Equation (5) will be obtained and expressed by $$I_{CUT\_m0,1} = \sum_{k=1}^{n-m} d_{km\_0,1} I_{LSB\_k} \quad (5)$$

It should be noted that the calibration method provided by this embodiment can always undertake error estimation no matter whether the current error is positive or negative. Further, this embodiment can increase the calibration range to ½ of the original pre-calibration current source ($I_{MSB\_m}$), as shown in Table.3.

TABLE 3

| | Partition I4 into two cells | | | | | |
|---|---|---|---|---|---|---|
| | $I_{CUT\_10}$ ($I_{MSB\_1}$) | $I_{CUT\_11}$ ($I_{MSB\_1}$) | Ics3 ($I_{LSB\_3}$) | Ics2 ($I_{LSB\_2}$) | Ics1 ($I_{LSB\_1}$) | $I_0$ |
| Ideal ratio | 4 | 4 | 4 | 2 | 1 | 1 |
| When $\Delta I_{10} = -2I$ and $\Delta I_{11} = 0$, mismatched $I_{MSB\_1}$ | 2 | 4 | 4 | 2 | 1 | 1 |
| Estimated digital weight of $I_{CUT\_10}$ | O.K. | — | 0 | 0 | 1 | 1 |
| Estimated digital weight of $I_{CUT\_11}$ | — | O.K. | 0 | 1 | 1 | 1 |
| When $\Delta I_{10} = 4I$ and $\Delta I_{11} = -2I$, mismatched $I_{MSB\_1}$ | 8 | 2 | 4 | 2 | 1 | 1 |
| Estimated digital weight of $I_{CUT\_10}$ | O.K. | — | 1 | 1 | 1 | 1 |
| Estimated digital weight of $I_{CUT\_11}$ | — | O.K. | 0 | 0 | 1 | 1 |

The circuit and method of this embodiment enable a DAC circuit to self-estimate and self-calibrate the weight errors without using any extra circuit (such as current source sub-arrays or capacitor sub-arrays), decreasing complexity of circuit design and exempted from the output errors caused by the mismatch between the additional circuit and the original circuit.

Recently, how to decrease the influence of the static non-linearity effect caused by the process variability has become an important subject in high-resolution circuit design. The present invention proposes a method to estimate the weight errors of high weight cells of DACs in a digital way, wherein each pre-estimation cell is partitioned into several smaller pre-estimation cells, and wherein the weight errors of the smaller pre-estimation cells are estimated in a digital way, and wherein the obtained information is used to calibrate the outputs of the DACs. Via using low weight cells to estimate and calibrate the weight errors of high weight cells, the present invention decreases the area overhead and complexity of the circuit, achieves a greater calibration range, and thus enhances the performance of the circuit.

The embodiments described above are only to exemplify the present invention but not to limit the scope of the present invention. Any modification or variation made according to the characteristic or spirit of the present invention is to be also included within the scope of the present invention, which is based on the claims stated below.

What is claimed is:

1. A digital-to-analog converter circuit comprising:
P pieces of conversion cells including A pieces of known weight conversion cells and (P-A) pieces of unknown weight conversion cells;
an output switching circuit electrically connecting with P pieces of said conversion cells and receiving output of each said conversion cell, dynamically selecting N pieces of said conversion cells from P pieces of said conversion cells as reference conversion cell groups, which at least include A pieces of said know weight conversion cells, according to digital control signals of a reference group in an error estimation mode, outputting a reference output (Ir) proportionally according to said digital control signals of said reference group, dynamically selecting at least one said unknown weight conversion cell from (P-A) pieces of said unknown weight conversion cells as pre-calibration conversion cell groups according to digital control signals of a pre-calibration group, and generating a pre-calibration output (Ic) smaller than a maximum value of said reference output;
an analog-to-digital converter generating a digital pre-calibration signal (Do) according to a difference of said reference output (Ir) and said pre-calibration signal (Ic);
a digital controller electrically connecting with said analog-to-digital converter and said output switching circuit, generating said digital control signals of said reference group and said digital control signals of said pre-calibration group to make said reference output approximate said pre-calibration output, generating a digital weight output after receiving said digital calibration signal (Do), using said digital weight outputs to establish a weight table, and working out an actual digital weight of each said unknown weight conversion cell according to said weight table; and
a calibration memory electrically connecting with said digital controller and storing said actual digital weight of each said unknown weight conversion cell, which said digital controller works out according to said weight table.

2. The digital-to-analog converter circuit according to claim 1, wherein said analog-to-digital converter is a comparator.

3. The digital-to-analog converter circuit according to claim 1, wherein weights of A pieces of said known weight conversion cells increase exponentially with base 2.

4. The digital-to-analog converter circuit according to claim 1, wherein nominal weight outputs of said unknown weight conversion cells are identical.

5. The digital-to-analog converter circuit according to claim 1, wherein said digital weight outputs in said weight table are respectively obtained from different said reference conversion cell groups each formed of N pieces of different said conversion cells.

6. The digital-to-analog converter circuit according to claim 1, wherein in a normal conversion mode, said digital controller receives a digital input signal and controls said output switching circuit according to contents of said calibration memory to generate a post-calibration analog output.

7. The digital-to-analog converter circuit according to claim 1, wherein said reference output (Ir) and said pre-calibration output (Ic) are differential signals.

8. A method to estimate weight errors of a digital-to-analog converter circuit, which applies to the digital-to-analog converter circuit according to claim 1 for estimating an actual weight of said pre-calibration output (Ic), comprising steps:
selecting M different pieces of said pre-calibration conversion cell groups to generate M different pieces of said pre-calibration outputs, wherein M is greater than or equal to (P-A);
using a successive approximation method to estimate each said pre-calibration output, and varying digital control signals of said reference group to make said reference output (Ir) approximate said pre-calibration output (Ic) successively and work out said digital weight output of said pre-calibration output; and
establishing said weight table according to said digital weight outputs of said pre-calibration outputs, repeating the abovementioned steps until said digital controller can work out said actual digital weight of each said unknown weight conversion cell according to said weight table, and storing said actual digital weights in said calibration memory.

9. The method to estimate weight errors of a digital-to-analog converter circuit according to claim 8, wherein said successive approximation method uses A pieces of said known weight conversion cells of said reference conversion cell groups and a portion of (P-A) pieces of said unknown weight conversion cells to estimate outputs ($I_{MSB\_1}$-$I_{MSB\_M}$) of M pieces of said pre-calibration conversion cell groups one by one.

10. The method to estimate weight errors of a digital-to-analog converter circuit according to claim 8, wherein in estimation, said digital controller uses a plurality of sets of simultaneous equations corresponding to contents of said weight table to work out said actual digital weights of (P-A) pieces of said unknown weight conversion cells at the same time.

11. The method to estimate weight errors of a digital-to-analog converter circuit according to claim 8, wherein said reference output (Ir) and said pre-calibration output (Ic) are differential signals.

12. The method to estimate weight errors of a digital-to-analog converter circuit according to claim 8, wherein (P-A) pieces of said unknown weight conversion cells are thermometer coded and provide outputs for said pre-calibration conversion cell groups to function as said pre-calibration outputs (Ic).

13. The method to estimate weight errors of a digital-to-analog converter circuit according to claim 8, wherein M pieces of said pre-calibration conversion cells are used to form two identical groups; weight outputs of each said group of conversion cells increase exponentially with base 2 and provide 2M pieces of outputs of said pre-calibration conversion cell groups to function as said pre-calibration outputs Ic.

14. The method to estimate weight errors of a digital-to-analog converter circuit according to claim 8, wherein each output ($I_{MSB\_1}$-$I_{MSB\_M}$) of said unknown weight conversion cells is partitioned into at least two lower weight outputs to guarantee that a smallest output of said pre-calibration conversion cell groups is not greater than a maximum value of said reference outputs.

15. The method to estimate weight errors of a digital-to-analog converter circuit according to claim 14, wherein each said output is partitioned into at least two smallest pre-calibration outputs ($\tilde{I}_{CL(m,n)}$, n∈{0, 1, ...}), which is expressed by $$\tilde{I}_{CL(m,n)} = \sum_k d_{k(m,n)} I_{LSB\_k} \le \sum_k I_{LSB\_k}$$

wherein $\Sigma d_{k(m,n)} I_{LSB\_k}$ are said reference outputs generated by N pieces of said reference conversion cell groups, and $d_{k(m,n)}$ are final digital control signals of said conversion cell groups, and wherein it is merely via said reference outputs ($I_{LSB\_k}$) provided by N pieces of said conversion cells to estimate digital weight outputs of said pre-calibration outputs.

16. A method to calibrate weight errors of a digital-to-analog converter circuit, which applies to the digital-to-analog converter circuit according to claim 1 for calibrating outputs of said pre-calibration groups, comprising steps:
using an actual weight table stored in said calibration memory to modify digital control signals of said conversion cells; and
using modified digital control signals of said pre-calibration conversion cell groups and said reference conversion cell groups to drive said conversion cells to generate post-calibration outputs of said digital-to-analog converter circuit, and calibrating output errors generated by (P-A) pieces of unknown weight conversion cells.

* * * * *